(12) United States Patent
Rogers et al.

(10) Patent No.: US 9,613,770 B2
(45) Date of Patent: *Apr. 4, 2017

(54) PROCESSES FOR FABRICATING MEMS SWITCHES AND OTHER MINIATURIZED DEVICES HAVING ENCAPSULATING ENCLOSURES

(71) Applicant: HARRIS CORPORATION, Melbourne, FL (US)

(72) Inventors: John E. Rogers, Gainesville, FL (US); Michael R. Weatherspoon, West Melbourne, FL (US)

(73) Assignee: Harris Corporation, Melbourne, FL (US)

(*) Notice: Subject to any disclaimer, the term of this patent is extended or adjusted under 35 U.S.C. 154(b) by 115 days.

This patent is subject to a terminal disclaimer.

(21) Appl. No.: 14/696,623

(22) Filed: Apr. 27, 2015

(65) Prior Publication Data
US 2015/0228430 A1   Aug. 13, 2015

Related U.S. Application Data

(62) Division of application No. 13/623,222, filed on Sep. 20, 2012, now Pat. No. 9,053,874.

(51) Int. Cl.
| | |
|---|---|
| *B05D 5/12* | (2006.01) |
| *H01H 49/00* | (2006.01) |
| *H01H 1/00* | (2006.01) |
| *H01H 59/00* | (2006.01) |
| *B05D 1/32* | (2006.01) |

(Continued)

(52) U.S. Cl.
CPC .......... *H01H 49/00* (2013.01); *H01H 1/0036* (2013.01); *H01H 59/0009* (2013.01); *B05D 1/32* (2013.01); *B05D 7/50* (2013.01); *B81C 1/00261* (2013.01); *B81C 1/00333* (2013.01); *Y10T 29/42* (2015.01); *Y10T 29/49105* (2015.01)

(58) Field of Classification Search
USPC ................... 427/58, 97.1, 98.4, 282
See application file for complete search history.

(56) References Cited

U.S. PATENT DOCUMENTS

| | | | |
|---|---|---|---|
| 4,670,724 A | 6/1987 | Riblet et al. | |
| 5,025,264 A | 6/1991 | Stafford | |

(Continued)

FOREIGN PATENT DOCUMENTS

| | | |
|---|---|---|
| DE | 102010034525 A1 | 2/2011 |
| EP | 0849820 A2 | 6/1998 |

(Continued)

OTHER PUBLICATIONS

U.S. Appl. No. 13/592,435, filed Aug. 23, 2012, Switches for Use in Microelectromechanical and Other Systems, and Processes for Making Same.

(Continued)

*Primary Examiner* — Brian K Talbot
(74) *Attorney, Agent, or Firm* — Fox Rothschild LLP; Robert J. Sacco; Carol E Thorstad-Forsyth

(57) ABSTRACT

Miniaturized devices such as MEMS switches (10) have encapsulating enclosures (100). The enclosure (100) and the remainder of the switch (10) are fabricated on a concurrent basis by depositing layers of an electrically-conductive material, such as copper, on a substrate (26).

19 Claims, 23 Drawing Sheets

(51) Int. Cl.
  *B81C 1/00* (2006.01)
  *B05D 7/00* (2006.01)

(56) References Cited

U.S. PATENT DOCUMENTS

| | | | |
|---|---|---|---|
| 6,384,353 B1 | 5/2002 | Huang et al. | |
| 6,587,021 B1 | 7/2003 | Streeter | |
| 6,600,395 B1 | 7/2003 | Handforth et al. | |
| 6,812,718 B1 | 11/2004 | Chong et al. | |
| 6,822,532 B2 | 11/2004 | Kane et al. | |
| 6,876,333 B2 | 4/2005 | Tasi | |
| 6,903,687 B1 | 6/2005 | Fink et al. | |
| 7,012,489 B2 | 3/2006 | Sherrer et al. | |
| 7,026,899 B2 | 4/2006 | Adams et al. | |
| 7,123,119 B2 | 10/2006 | Pashby et al. | |
| 7,126,447 B2 | 10/2006 | Kawai | |
| 7,259,640 B2 | 8/2007 | Brown et al. | |
| 7,381,583 B1 * | 6/2008 | Ebel | B81C 1/00333 200/181 |
| 7,449,784 B2 | 11/2008 | Sherrer et al. | |
| 7,898,356 B2 | 3/2011 | Sherrer et al. | |
| 8,354,902 B2 | 1/2013 | Kawabata et al. | |
| 8,921,997 B2 * | 12/2014 | Shimooka | B81C 1/00333 257/704 |
| 2004/0066338 A1 | 4/2004 | Chen et al. | |
| 2004/0069608 A1 | 4/2004 | Shimizu et al. | |
| 2004/0166603 A1 | 8/2004 | Carley | |
| 2004/0189530 A1 | 9/2004 | Chung et al. | |
| 2005/0001701 A1 | 1/2005 | Shirakawa | |
| 2005/0067292 A1 | 3/2005 | Thompson et al. | |
| 2005/0073380 A1 | 4/2005 | Howell et al. | |
| 2005/0116788 A1 | 6/2005 | Matters-Kammerer et al. | |
| 2005/0146022 A1 * | 7/2005 | Franosch | B41J 2/1603 257/704 |
| 2005/0161753 A1 | 7/2005 | Huff et al. | |
| 2005/0190019 A1 | 9/2005 | Metz | |
| 2007/0018761 A1 | 1/2007 | Yamanaka et al. | |
| 2008/0142347 A1 | 6/2008 | Lewis et al. | |
| 2008/0164542 A1 | 7/2008 | Yang et al. | |
| 2010/0277259 A1 | 11/2010 | Ahn et al. | |
| 2011/0220472 A1 | 9/2011 | Masuda et al. | |
| 2012/0175715 A1 | 7/2012 | Hammond et al. | |
| 2013/0140165 A1 | 6/2013 | Lin et al. | |

FOREIGN PATENT DOCUMENTS

| | | |
|---|---|---|
| EP | 1515390 A1 | 3/2005 |
| EP | 1713144 A1 | 10/2006 |
| EP | 1939974 A1 | 7/2008 |
| EP | 2546920 A1 | 1/2013 |
| ES | 2191642 | 9/2003 |
| WO | 03/049514 A2 | 6/2003 |
| WO | 2004/079795 A2 | 9/2004 |
| WO | 2011/111274 A1 | 9/2011 |

OTHER PUBLICATIONS

U.S. Appl. No. 13/623,188, filed Sep. 20, 2012, Switches for Use in Microelectromechanical and Other Systems, and Processes for Making Same.
U.S. Appl. No. 13/592,506, filed Aug. 23, 2012, Distributed Element Filters for Ultra-Broadband Communications.
U.S. Appl. No. 13/650,252, filed Oct. 12, 2012, Wafer-Level RF Transmission and Radiation Devices.
U.S. Appl. No. 13/654,554, filed Oct. 18, 2012, Directional Couplers With Variable Frequency Response.
U.S. Appl. No. 13/672,863, filed Nov. 9, 2012, Switches for Use in Microelectromechanical and Other Systems, and Processes for Making Same.
U.S. Appl. No. 14/691,953, filed Apr. 21, 2015, Switches for Use in Microelectromechanical and Other Systems, and Processes for Making Same.
International Preliminary Report on Patentability dated Apr. 30, 2015 issued in International Appln. No. PCT/US2013/065405 (6 pages).
Information about Related Patents and Patent Applications, see section 6 of the accompanying Information Disclosure Statement Letter, which concerns Related Patents and Patent Applications.
U.S. Appl. No. 13/623,222, filed Sep. 20, 2012, MEMS Switches and Other Miniaturized Devices Having Encapsulating Enclosures and Processes for Fabricating Same.
Information about Related Patents and Patent Applications.
International Search Report and Written Opinion dated Dec. 20, 2013 issued in International Appln. No. PCT/US2013/056368 (12 pages).
International Search Report and Written Opinion dated Jan. 16, 2014 issued in International Appln. No. PCT/US2013/06443 (12 pages).
International Search Report and Written Opinion mailed Nov. 28, 2013 for Interational Patent Appln. No. PCT/US2013/056316 to Harris Corporation (11 pages).
International Search Report and Written Opinion mailed Jan. 31, 2014 in International Patent Appln. No. PCT/US2013/065405 to Harris Corporation (9 pages).
Lau, N.U.and Sloan, R., Suspended Microstrip Patch Antenna With Ground-shield Tapered Suspended Stripline Feed, 33rd European Microwave Conference, Munich 2003, 1385-1387.
Information about Related Patents and Patent Applications, Jan. 18, 2013.
International Preliminary Report on Patentability dated Mar. 24, 2015 issued in International Appln. No. PCT/US2013/060814 (7 pages).
International Preliminary Report on Patentability dated Mar. 24, 2015 issued in International Appln. No. PCT/US2013/060817 (8 pages).

* cited by examiner

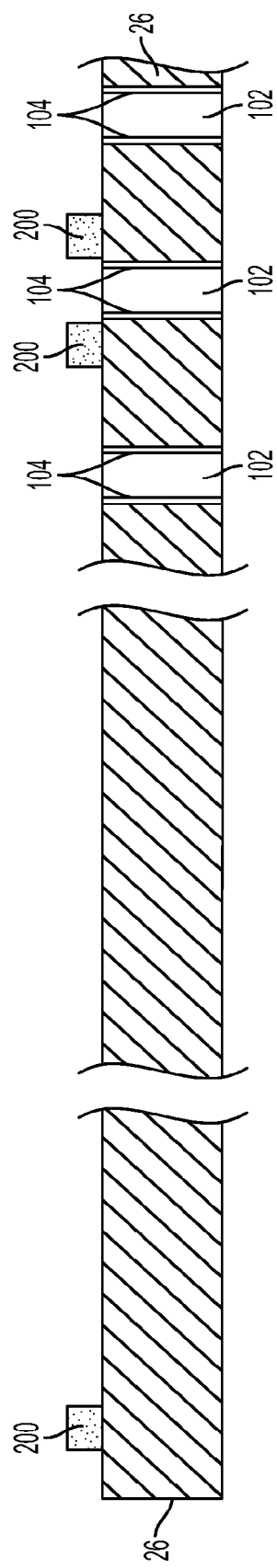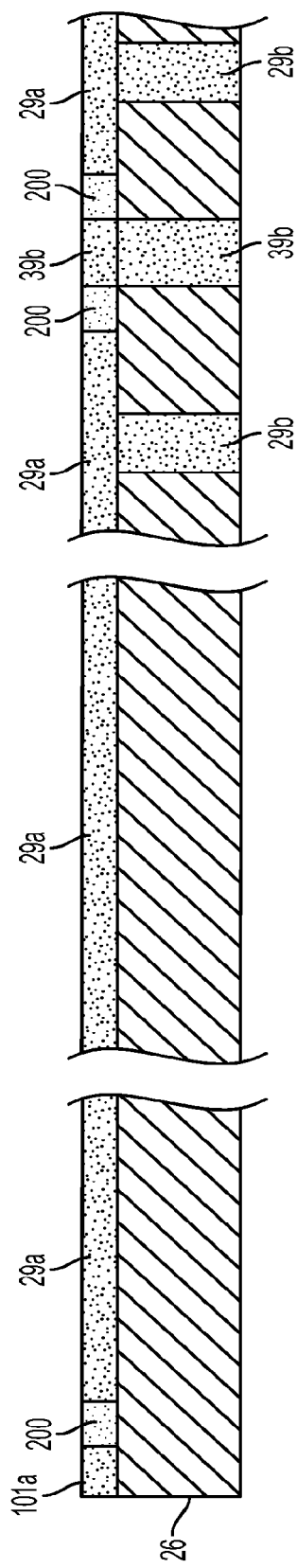

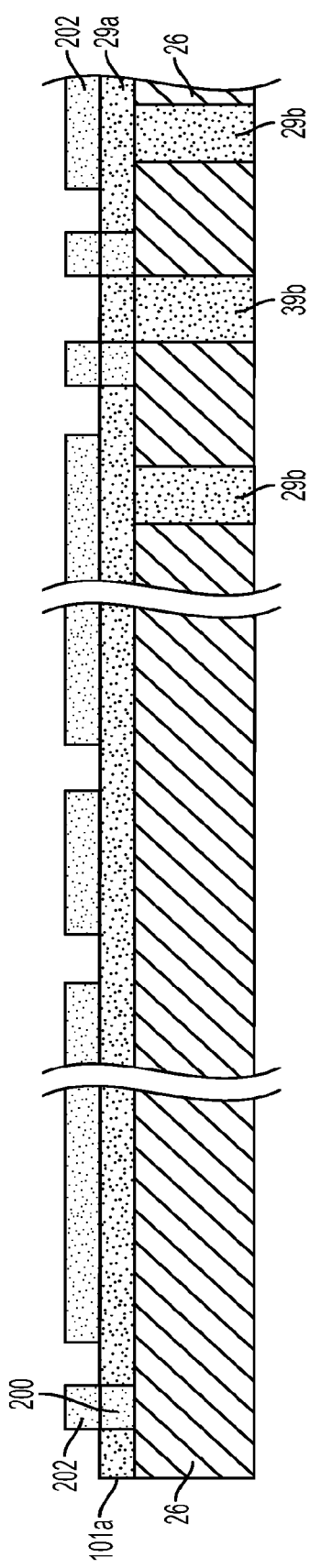

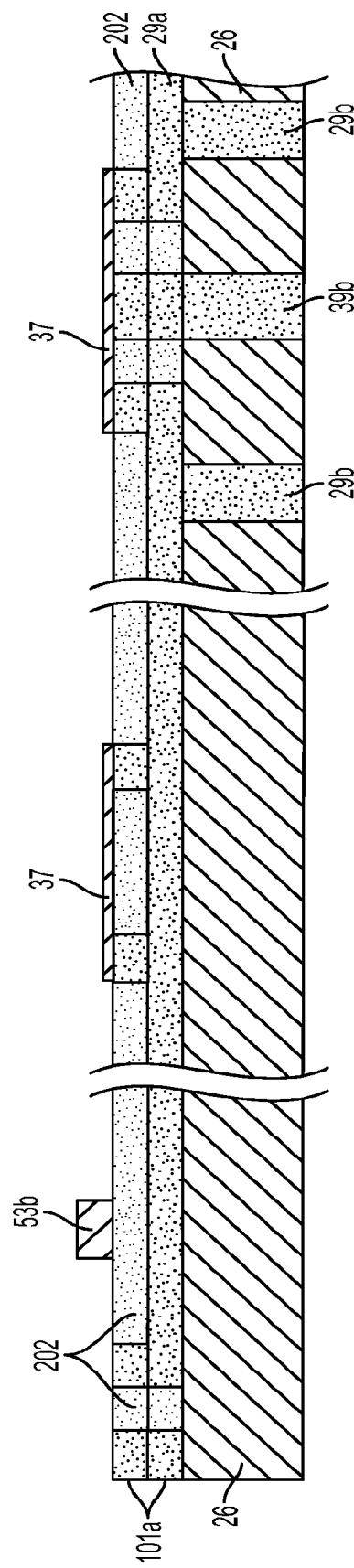

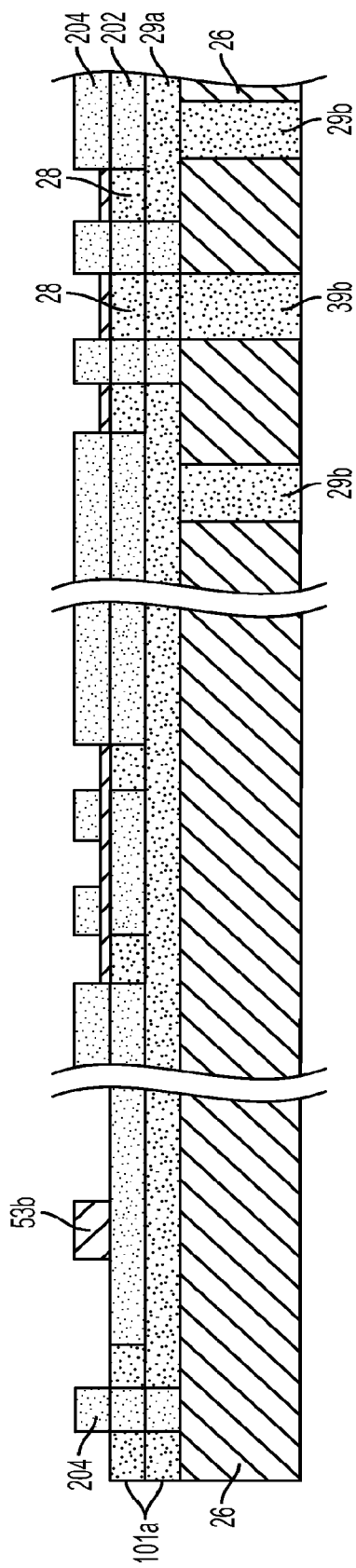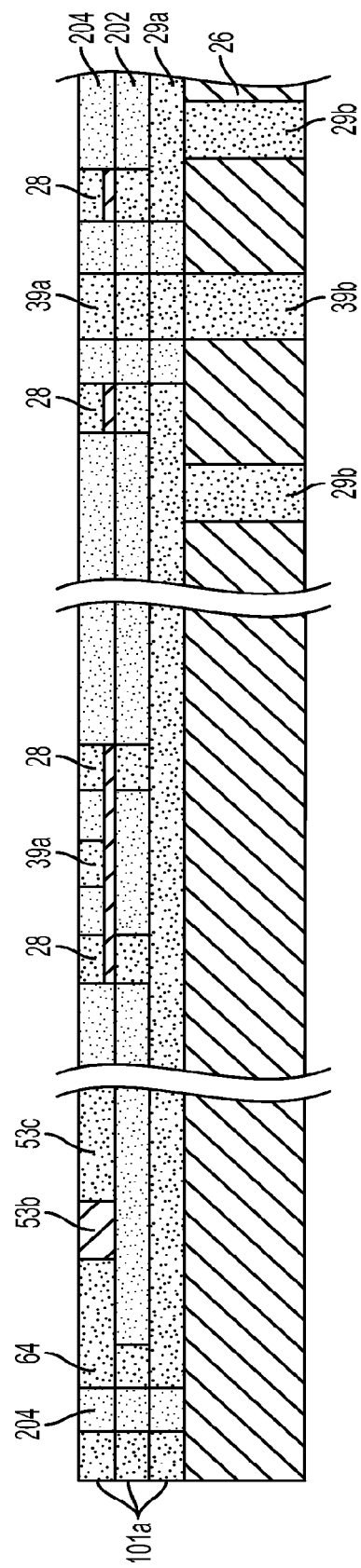

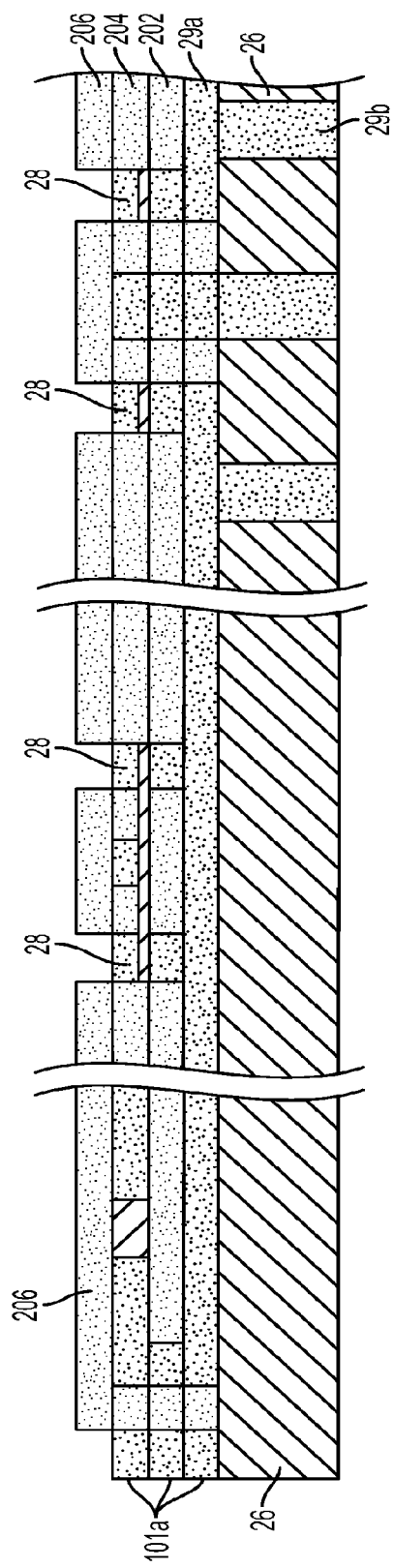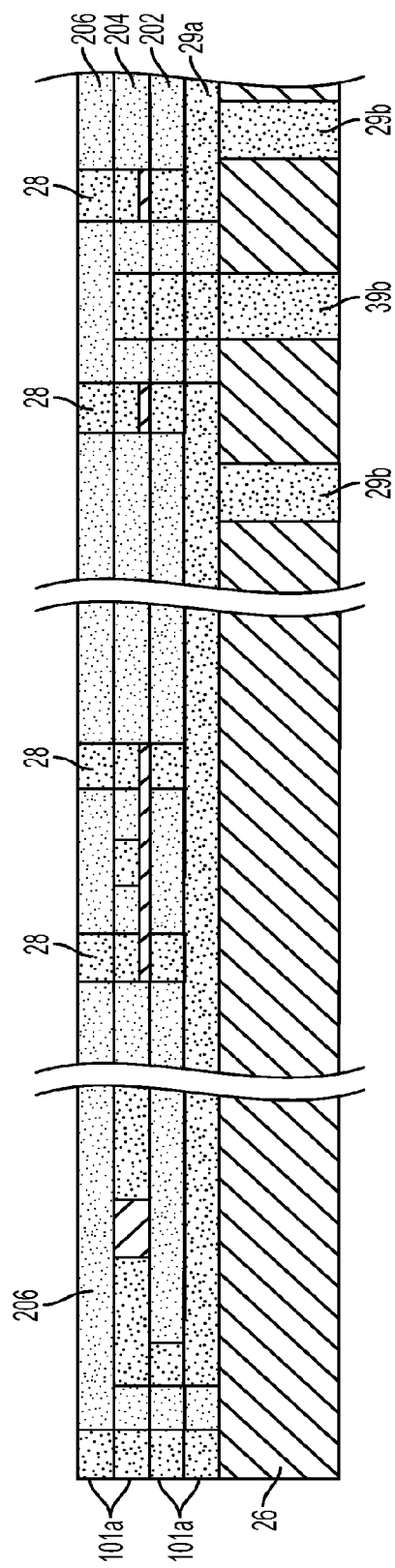

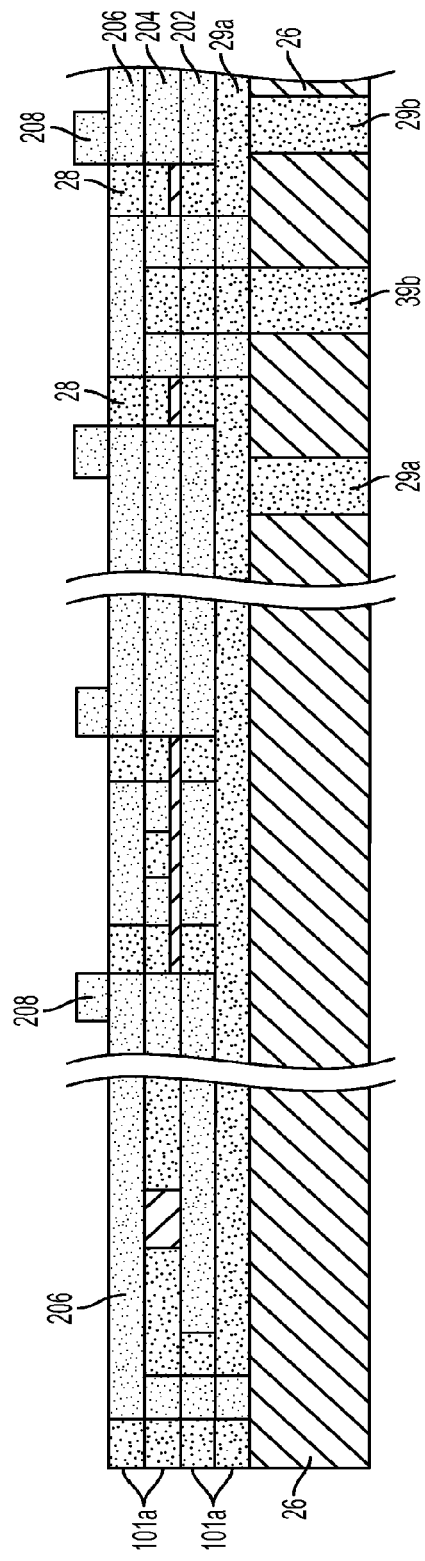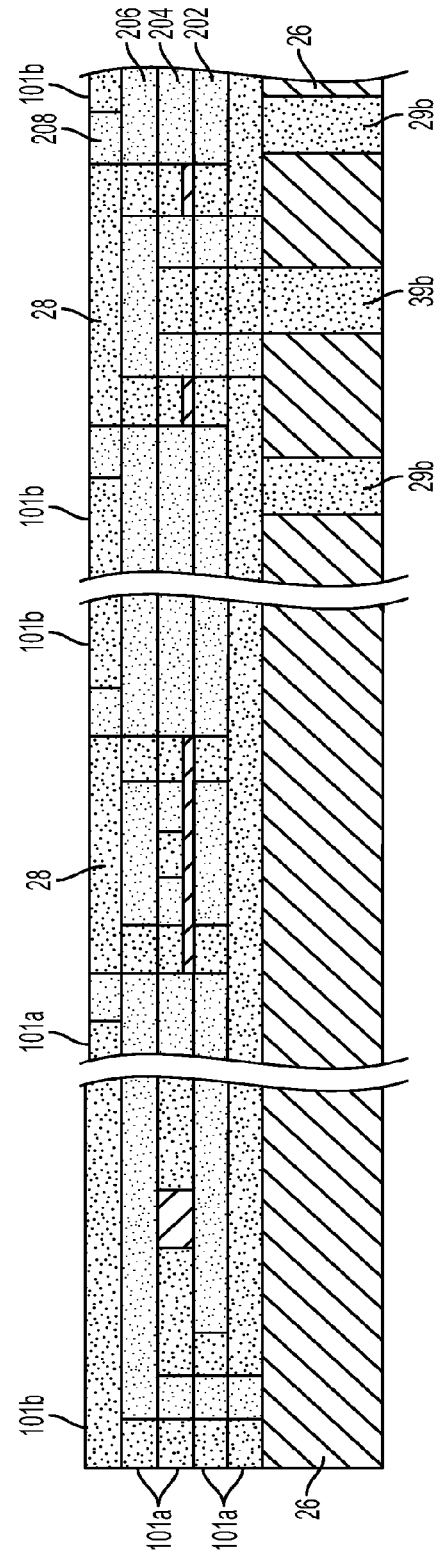

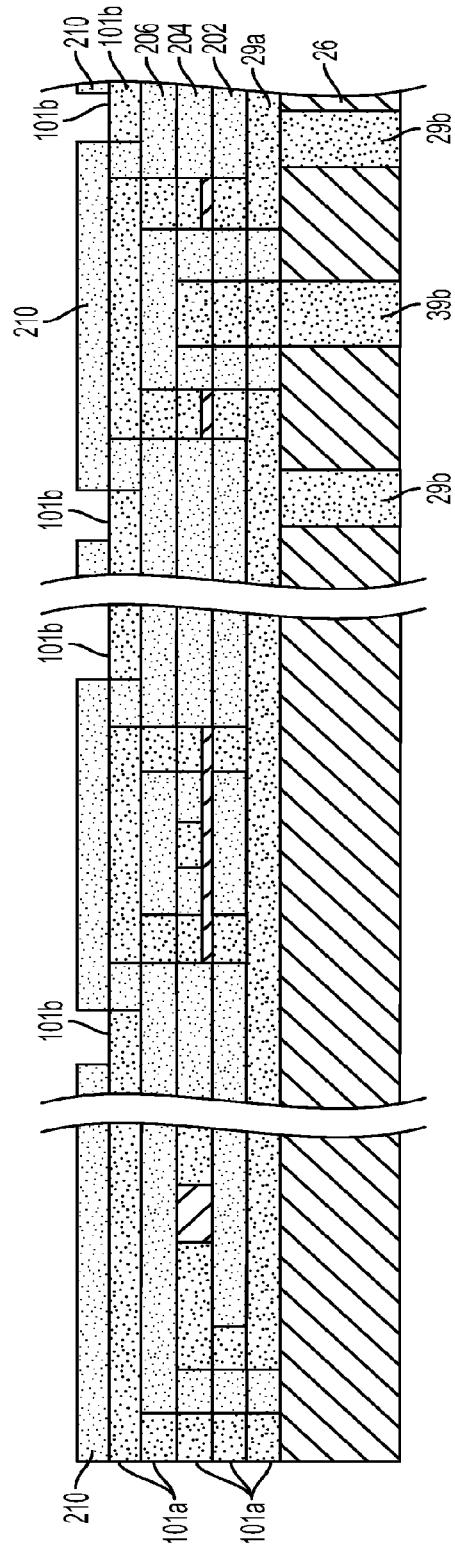
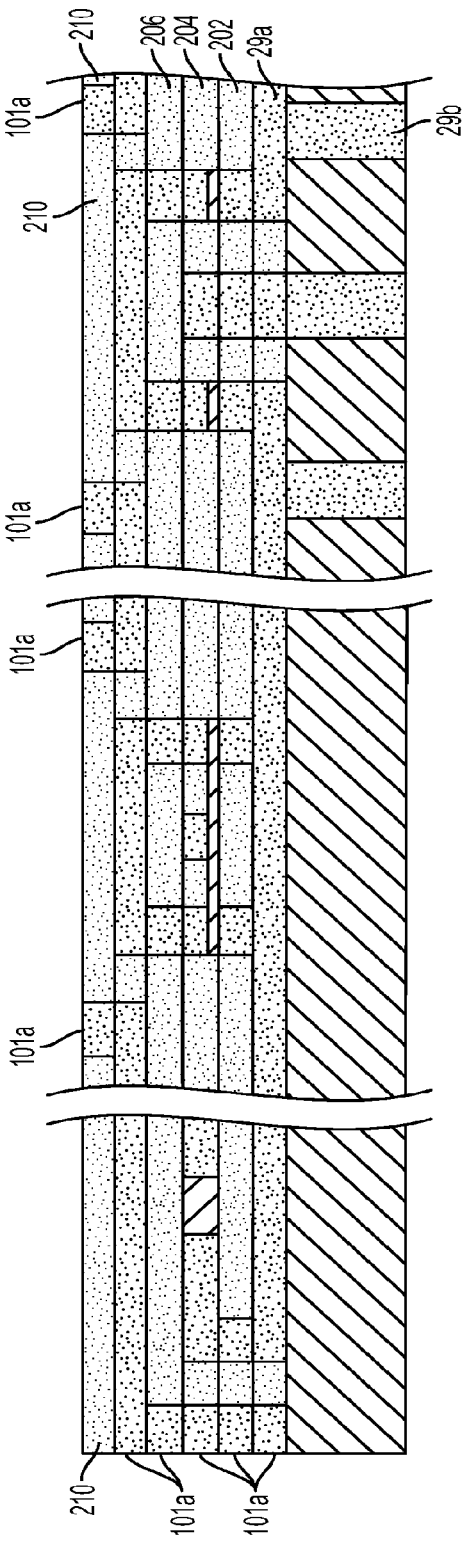
FIG. 25A  FIG. 25B  FIG. 25C
FIG. 26A  FIG. 26B  FIG. 26C

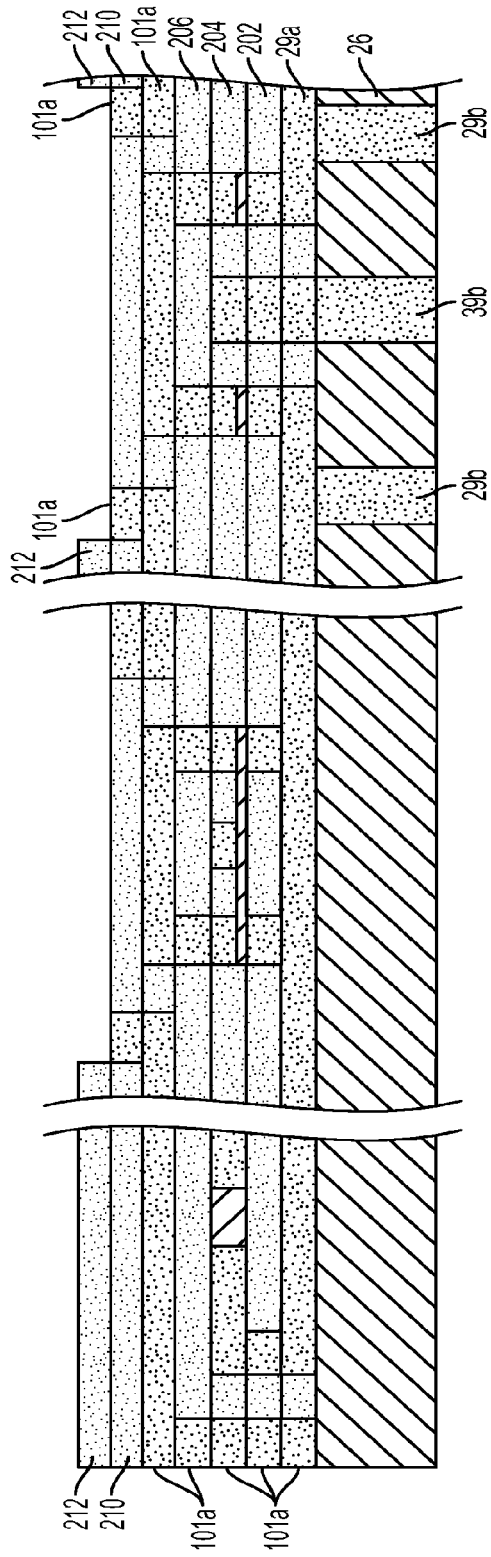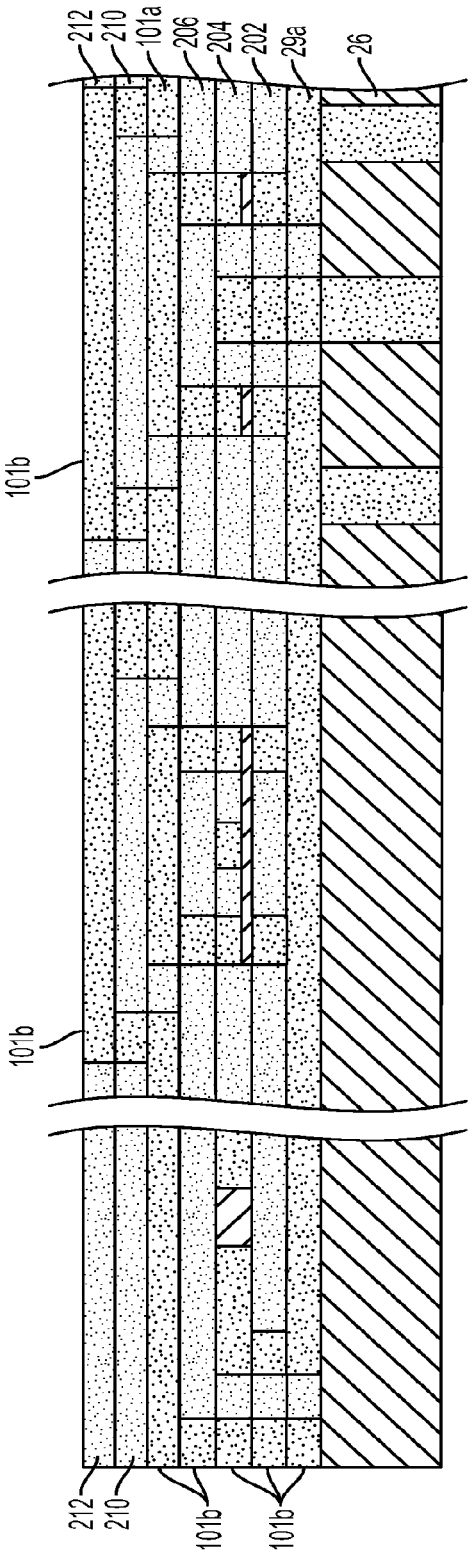

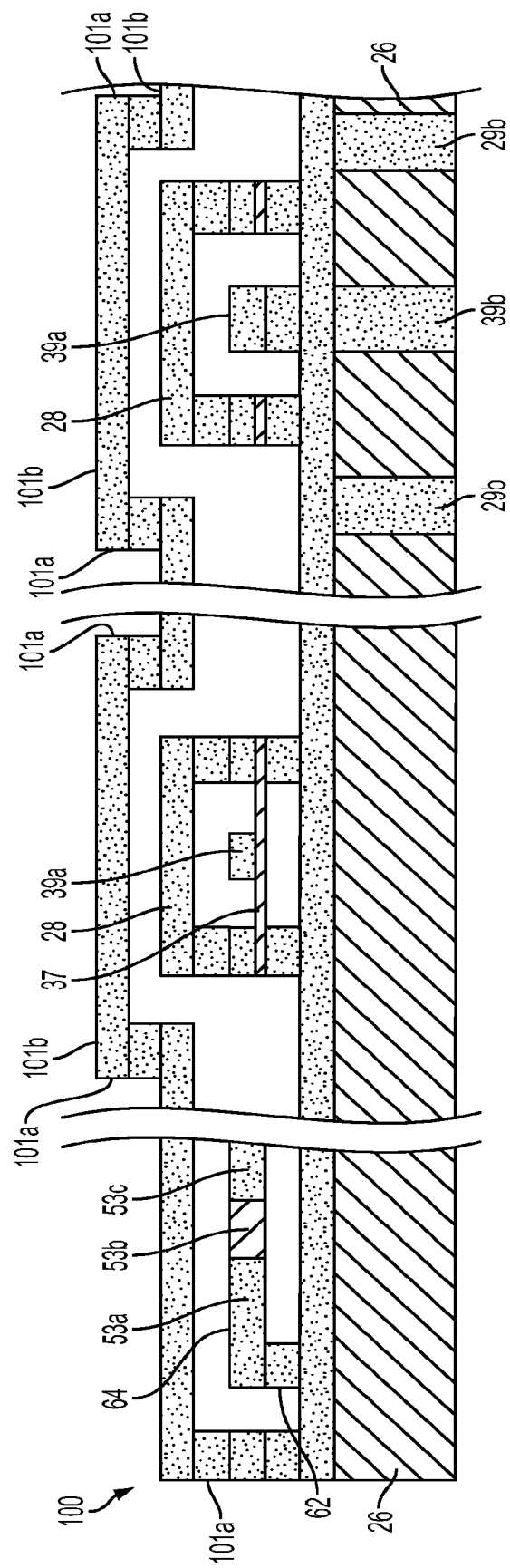

PROCESSES FOR FABRICATING MEMS SWITCHES AND OTHER MINIATURIZED DEVICES HAVING ENCAPSULATING ENCLOSURES

CROSS-REFERENCE TO RELATED APPLICATION

This application is a divisional application of and claims priority to co-pending non-provisional U.S. patent application Ser. No. 13/623,222 filed on Sep. 20, 2012(now U.S. Pat. No. 9,053,874),which is hereby incorporated by reference in its entirety.

BACKGROUND OF THE INVENTION

Statement of the Technical Field

The inventive arrangements relate to miniaturized switches and other devices, such as microelectromechanical systems (MEMS) switches, tunable and non-tunable filters, couplers, phase shifters, and phased array antennas (PAA) equipped with encapsulating enclosures.

Description of Related Art

Miniaturized switches such as monolithic microwave integrated circuit (MMIC) and MEMS switches are commonly used in broadband communications systems. In general, the presence of small moving parts in MEMS devices makes it necessary to provide the devices with some sort of protection from mechanical damage, e.g., stiction, as well as from environmental contaminants, e.g., moisture, humidity, particulates, etc. Achieving such protection, however, can result in significant increases in the overall footprint of the switch, can add complexity to its design, and can increase the number of steps needed to fabricate the switch. Moreover, the need to electrically interconnect the switch to other components can make it difficult or unfeasible to seal the switch to obtain the requisite degree of protection.

Three-dimensional microstructures can be formed by utilizing sequential build processes. For example, U.S. Pat. Nos. 7,012,489 and 7,898,356 describe methods for fabricating coaxial waveguide microstructures. These processes provide an alternative to traditional thin film technology, but also present new design challenges pertaining to their effective utilization for advantageous implementation of various devices such as miniaturized switches.

SUMMARY OF THE INVENTION

Processes for fabricating miniaturized switches with encapsulating enclosures comprise selectively applying an electrically-conductive material to a portion of a substrate to form a first layer of the switch. The first layer of the switch comprises at least a portion of a ground plane; a portion of an actuator; and a portion of a side of the enclosure. The processes further include selectively applying more of the electrically-conductive material to form a second layer of the switch. The second layer comprises a second portion of the actuator; and a second portion of the side of the enclosure. The processes also include selectively applying more of the electrically-conductive material to form a third layer of the switch. The third layer comprises a contact element configured to be moved by the actuator into and out of contact with a first and a second electrical conductor of the switch.

Processes for fabricating miniaturized switches with encapsulating enclosures include selectively applying an electrically-conductive material to a portion of a substrate to form a first layer of the switch. The first layer of the switch includes at least a portion of a ground plane; a portion of an actuator; and a portion of a side of the enclosure. The processes further include selectively applying more of the electrically-conductive material to form a second layer of the switch. The second layer includes another portion of the actuator; and another portion of the side of the enclosure. The processes also include selectively applying more of the electrically-conductive material to form a third layer of the switch. The third layer includes at least a portion of the side of the enclosure and a contact element configured to be moved by the actuator into and out of contact with a first and a second electrical conductor of the switch.

In accordance with another aspect of the inventive concepts disclosed herein, miniaturized switches include a substrate; an electrically-conductive housing disposed on the substrate; a first electrical conductor suspended within the housing on electrically-insulative supports; and a second electrical conductor spaced apart from the first electrical conductor. The switches further include a contact element configured for movement between a first position at which the contact element is spaced apart and electrically isolated from the first and second electrical conductors, and a second position at which the contact element contacts the first and second electrical conductors. The switches also include an enclosure mounted on the substrate. The substrate and the enclosure define a hermetically sealed volume. The housing, the first and second electrical conductors, and the contact element are disposed within the volume.

In accordance with a further aspect of the inventive concepts disclosed herein, processes are provided for fabricating a MEMS device having an encapsulating enclosure. The processes include utilizing a first mask to form an exposed portion of a photoresist material on a portion of the substrate, and applying an electrically-conductive material to an exposed portion of the substrate to form a first layer of the device. The first layer of the device includes at least a portion of a ground plane and a first portion of a side of the enclosure. The processes also include utilizing a second mask to form an exposed portion of more of the photoresist material on a portion of the first layer, and subsequently applying more of the electrically-conductive material to form a second layer of the device. The second layer of the device comprises a first portion of a housing and a second portion of the side of the enclosure. The processes further include utilizing a third mask to form an exposed portion of more of the photoresist material on a portion of the second layer, and subsequently applying more of the electrically-conductive material to form a third layer of the device. The third layer of the device comprises a second portion of the housing; at least a portion of an electrical conductor suspended within, electrically insulated from, and spaced apart from the housing; and a third portion of the side of the enclosure.

BRIEF DESCRIPTION OF THE DRAWINGS

Embodiments will be described with reference to the following drawing figures, in which like numerals represent like items throughout the figures and in which:

FIGS. 14A, 15A, 16A, . . . 29A are cross-sectional views, taken through the line "E-E" of FIG. 1, depicting portions the switch shown in FIGS. 1-13 during various stages of fabrication; and FIGS. 14B, 15B, 16B, . . . 29B are cross-sectional views, taken through the line "F-F" of FIG. 1, depicting portions the switch shown in FIGS. 1-13 during various stages of fabrication; and FIGS. 14C, 15C, 16C, . . . 29C are cross-sectional views, taken through the line "D-D" of FIG. 1, depicting portions the switch shown in FIGS. 1-13 during various stages of fabrication.

DETAILED DESCRIPTION

Figure 1:
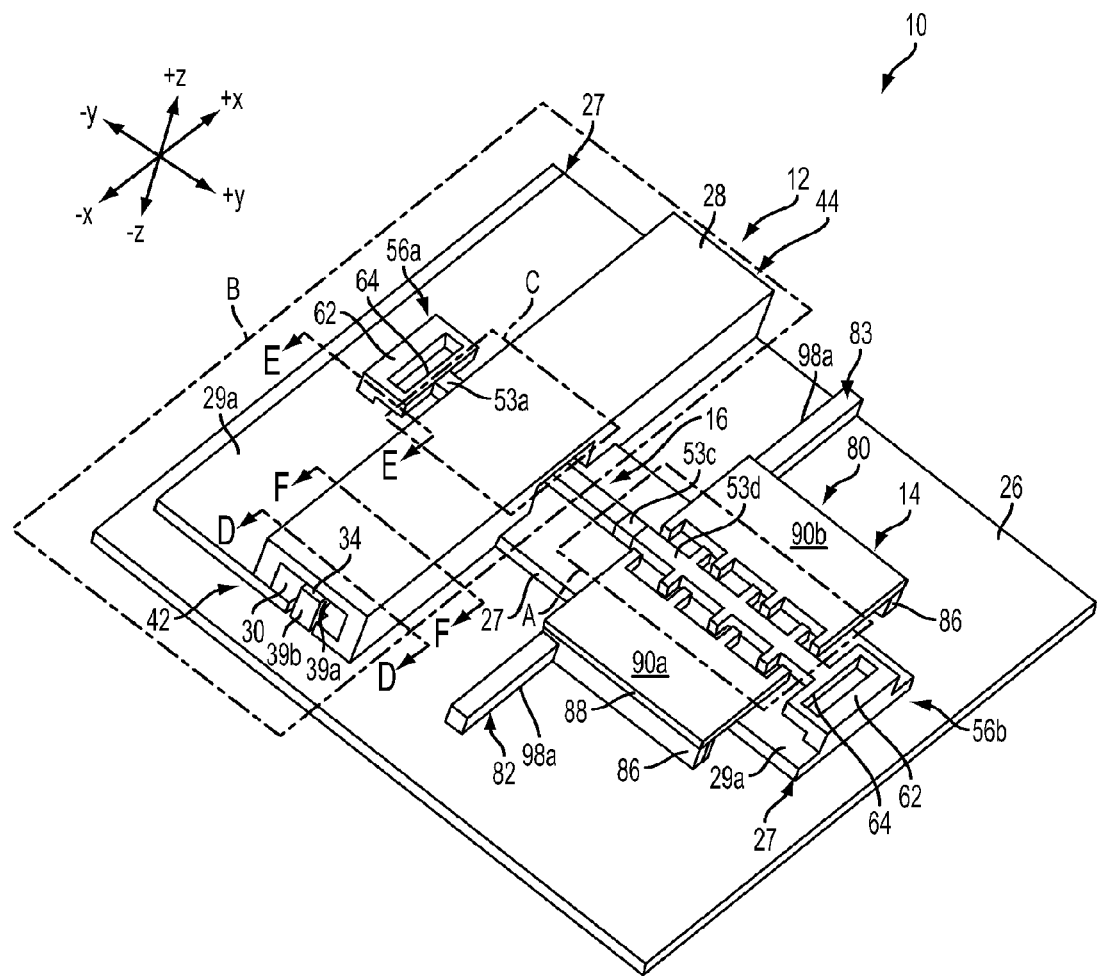
FIG. 1 is a top perspective view of a MEMS switch without its encapsulating enclosure, depicting a shuttle of the switch in an open position.

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

The figures depict a miniaturized switching device in the form of a MEMS switch 10 having an encapsulating enclosure 100. The enclosure 100 hermetically seals the remainder of the switch 10 from its surrounding environment. As discussed in detail below, the enclosure 100 and the remainder of the switch 10 are fabricated on a concurrent basis by depositing layers of an electrically-conductive material, such as copper (Cu), on an upper surface of a substrate 26. The enclosure 100, and a process for its fabrication, are described herein in connection with the remainder of the switch 10, a substantially vertical switch, which is detailed for exemplary purposes only. Alternative embodiments of the enclosure 100 can be used with other types of switches, and with other types of devices, such as filters, couplers, phase shifters, and phased array antennas (PAA), etc. For example, alternative embodiments of the enclosure 100 can be used to encapsulate the switches disclosed in pending U.S. application Ser. No. 13/623,188, filed Sep. 20, 2012, titled "Switches for use in Microelectromechanical and Other Systems, and Processes for Making Same,".

The switch 10 can selectively establish and disestablish electrical contact between a first and second electronic component (not shown) electrically connected thereto. The portion of the switch 10 within the enclosure 100 has a maximum height ("z" dimension) of approximately 1 mm; a maximum width ("y" dimension) of approximately 3 mm; and a maximum length ("x" dimension) of approximately 3 mm. The enclosure 100 has a maximum height of approximately 1.5 mm; a maximum width of approximately 4 mm; and a maximum length of approximately 4 mm. The switch 10 is described as a MEMS switch having these particular dimensions for exemplary purposes only. Alternative embodiments of the switch 10 can be scaled up or down in accordance with the requirements of a particular application, including size, weight, and power (SWaP) requirements.

The substrate 26 is formed from high-electrical-resistivity aluminum nitride (AlN). The substrate 26 can be formed from other dielectric materials, such as silicon (Si), glass, silicon-germanium (SiGe), or gallium arsenide (GaAs) in alternative embodiments. The substrate 26 can have a thickness, i.e., "z" dimension, of approximately 125 μm.

Figure 4:
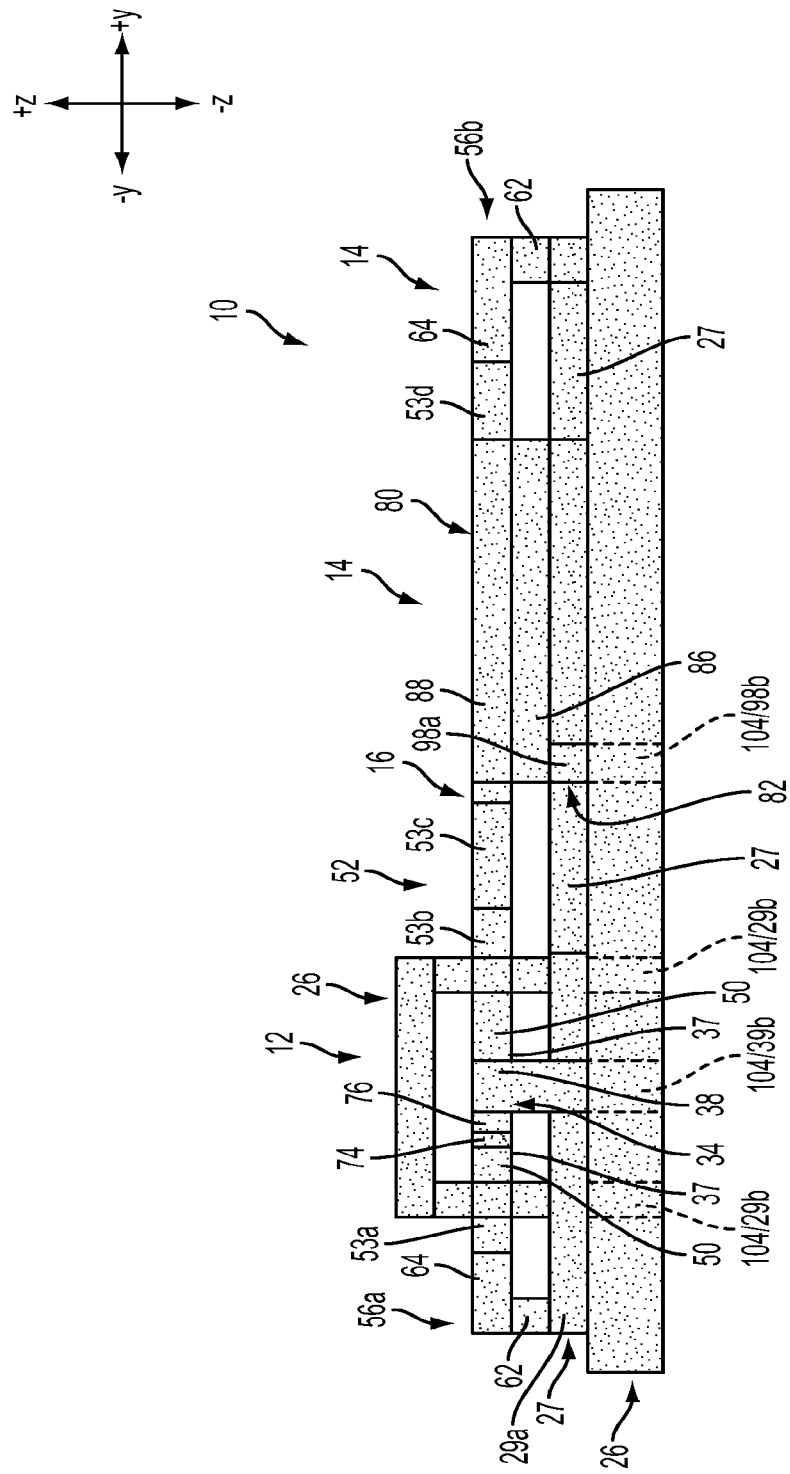
FIG. 4 front view of the switch shown FIGS. 1-3, depicting the shuttle in the open position and showing the layered structure of the switch, and with relief added to better denote the illustrated structure.
Figure 8:
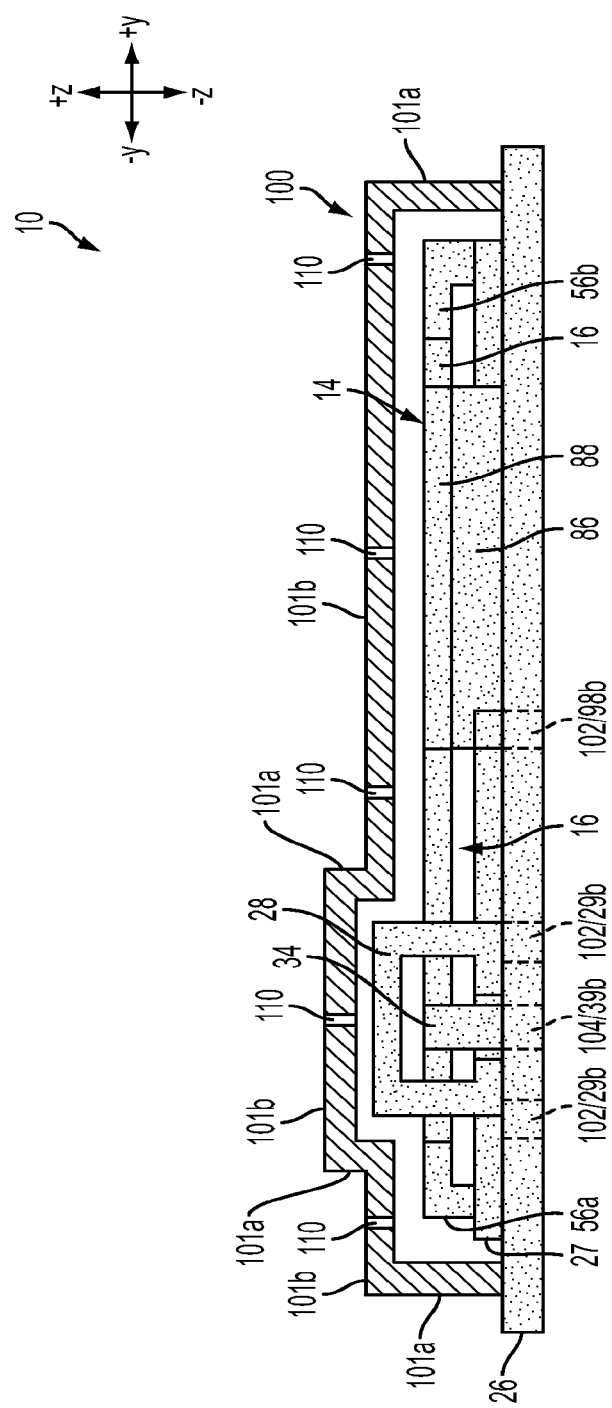
FIG. 8 is a cross-sectional view of the enclosure shown in FIG. 7, taken along the line "G-G" of FIG. 7 and depicting the remainder of the switch of FIGS. 1-6B within the enclosure.
Figure 9:
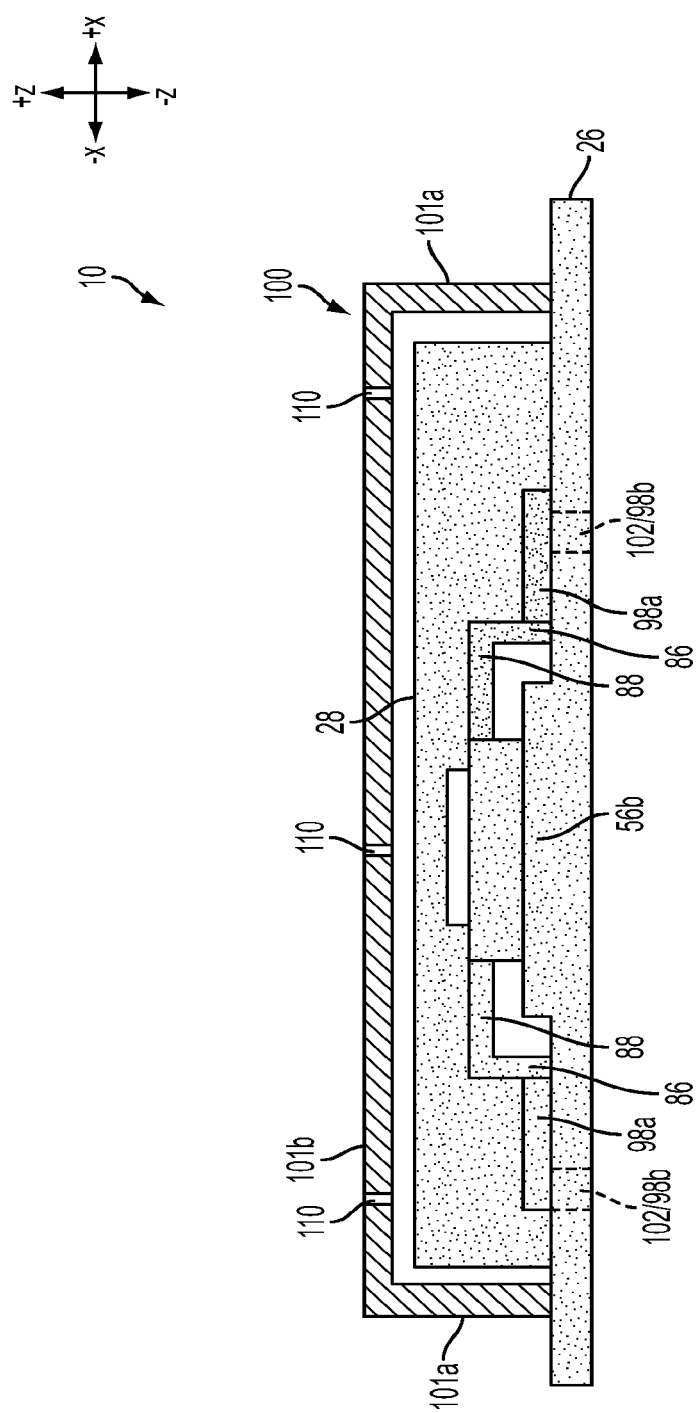
FIG. 9 is a cross-sectional view of the enclosure shown in FIG. 7, taken along the line "H-H" of FIG. 7 and depicting the remainder of the switch of FIGS. 1-6B within the enclosure.

The switch 10 and the enclosure 100 are formed from layers of an electrically-conductive material such as copper (Cu). A lowermost layer of the copper material is deposited directly on the substrate 26, as shown in FIGS. 4, 8, and 9. The portion of the switch 10 located within the enclosure 100 is formed from five layers of the copper material, and the enclosure 100 is formed from seven layers of the copper material. Although the individual structures that form the enclosure 100 and the remainder of the switch 10 are co-located on five of the seven layers that make up the overall structure, the enclosure 100 and the structural components that make up the remainder of the switch 10 are electrically and mechanically isolated from each other within each layer. In alternative embodiments, the enclosure 100 can be electrically connected to a ground plane 27 of the switch 10, so that the enclosure 100 is subjected to the same ground or reference voltage as the ground plane 27. In such embodiments, the enclosure may comprise five layers of the electrically-conductive material.

As discussed in detail below, each layer of copper material is configured to provide the required geometry for the switch 10 on that particular layer. The first layer is formed by selectively applying photodefinable, or photoresist masking material to portions of the substrate 26. The photoresist material is applied as to leave only exposed areas in which structure of the first layer of the switch 10. The copper material is subsequently deposited in the exposed areas to form, or build up the first layer of the switch 10. The remaining layers of the switch 10 are subsequently formed on a sequential basis by selectively applying photoresist masking material to portions of the previously-formed layers, and depositing additional copper material in the exposed areas to form the remaining layers.

Each layer of the copper material can have a thickness of, for example, approximately 50 μm. The number of layers of copper material used to form the switch 10 is applicant-dependent, and can vary with factors such as the complexity of the design, hybrid or monolithic integration of other devices with the switch 10, the overall height of the switch 10, the thickness of each layer, etc. The number of layers of copper material used to form the enclosure 100 is formed is dependent upon the number of layers in the remainder of the switch 10. For example, the enclosure 100 is formed from seven layers, in order to maintain electrical and mechanical isolation from the other components of the switch 10 while minimizing the overall height, or "z" dimension of the enclosure 100.

The ground plane 27 is disposed on the substrate 26, as shown in FIGS. 1 and 4. The ground plane 27 has a major portion 29a that is formed as part of a first or lowermost layer of the electrically-conductive material. The ground plane 27 further includes four legs 29b that extend downwardly from the major portion 29a. The legs 29b are depicted in FIGS. 12 and 15C-29C.

Figure 10:
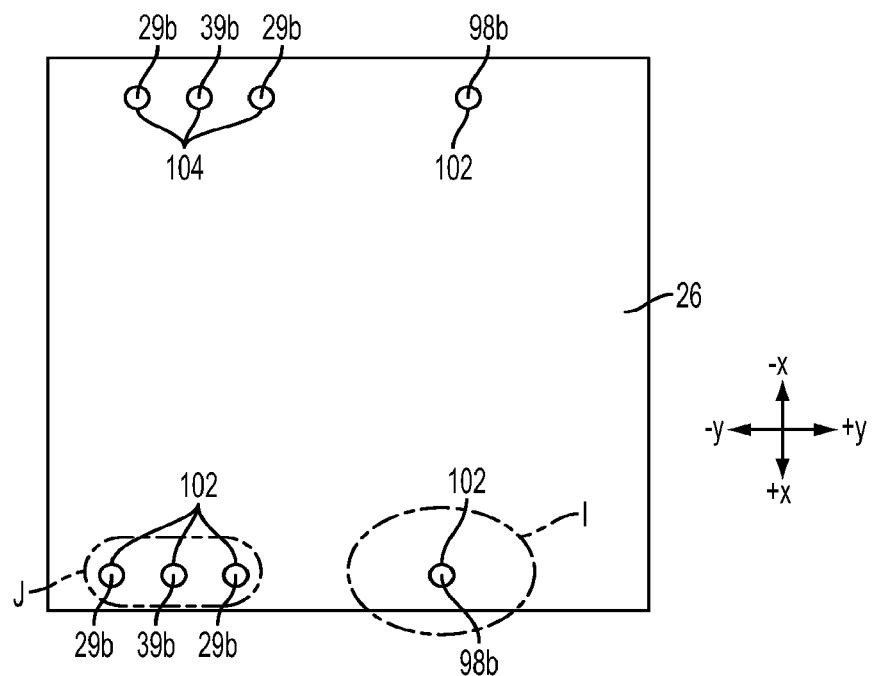
FIG. 10 is a bottom view of a substrate of the switch shown FIGS. 1-9, depicting various electrical interconnection points for the switch disposed within vias formed in the substrate.
Figure 11:
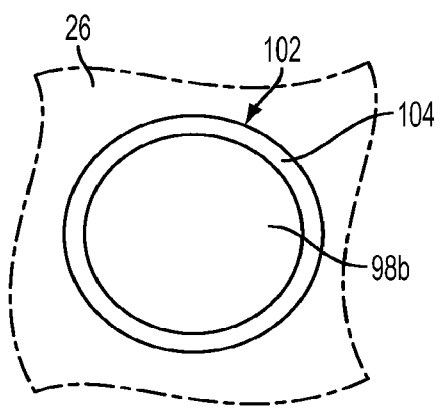
FIG. 11 is a magnified view of the area designated "I" in FIG. 10.

The substrate 26 has a plurality of vias 102 formed therein, as illustrated in FIGS. 10-12 and 14C. Four of the vias 102 accommodate the respective legs 29b of the ground plane 27, as illustrated in FIGS. 4, 10, 12, and 15C-29C. Each via 102 extends between the upper and lower surfaces of the substrate 26. The vias 102 can be formed by a suitable technique such as milling or laser drilling. The vias 102 are metalized, i.e., the surface of the substrate 26 that defines each via 102 is covered with a coating 104 of an electrically-conductive material such as copper, as can be seen in FIG. 11. As discussed below, the material from which the legs 29b are formed is deposited in the corresponding vias 102 when the first layer of switch 10 is formed.

The ground plane 27 electrically contacts the coating 104 of the four vias 102 by way of the legs 29b. The coating 104 associated with each via 102 adjoins an associated electrically-conductive pad (not shown) formed on the lower surface of the substrate 26. The pads are electrically connected to a ground or reference voltage source (also not shown). The ground plane 27, therefore, is electrically connected to the ground or reference voltage source by way of the pads and the coatings 104 of the associated vias 102. Other means for forming the requisite electrical interconnections between the switch 10 and the first and second electronic devices can be used in alternative embodiments.

The switch 10 comprises a contact portion 12, an actuator portion 14, and a contact element in the form of a shuttle 16, as shown in FIG. 1. The first and second electronic components are electrically connected to opposite ends of the contact portion 12, and are electrically connected to each other on a selective basis via the contact portion 12. As discussed below, the shuttle 16 moves in the "y" direction between an open and a closed position, in response to energization and de-energization of the actuator portion 14. The shuttle 16 facilitates the flow of electric current through the contact portion 12 when the shuttle 16 is in its closed position, thereby establishing electrical contact between the first and second electronic components. Current does not flow through the contact portion 12 when the shuttle 16 is in its open position. Thus, the first and second electronic components are electrically isolated from each other when the shuttle 16 is in its open position.

The contact portion 12 of the switch 10 includes an electrically-conductive ground housing 28 disposed on the ground plane 27, as illustrated in FIGS. 1 and 4. The ground housing 28 is formed from portions of the second through fifth layers of the electrically-conductive material. The ground housing 28 and the underlying portion of the ground plane 27 define an internal channel 30 that extends substantially in the "x" direction, as depicted in FIGS. 1-4, 6A, and 6B.

Figure 2:
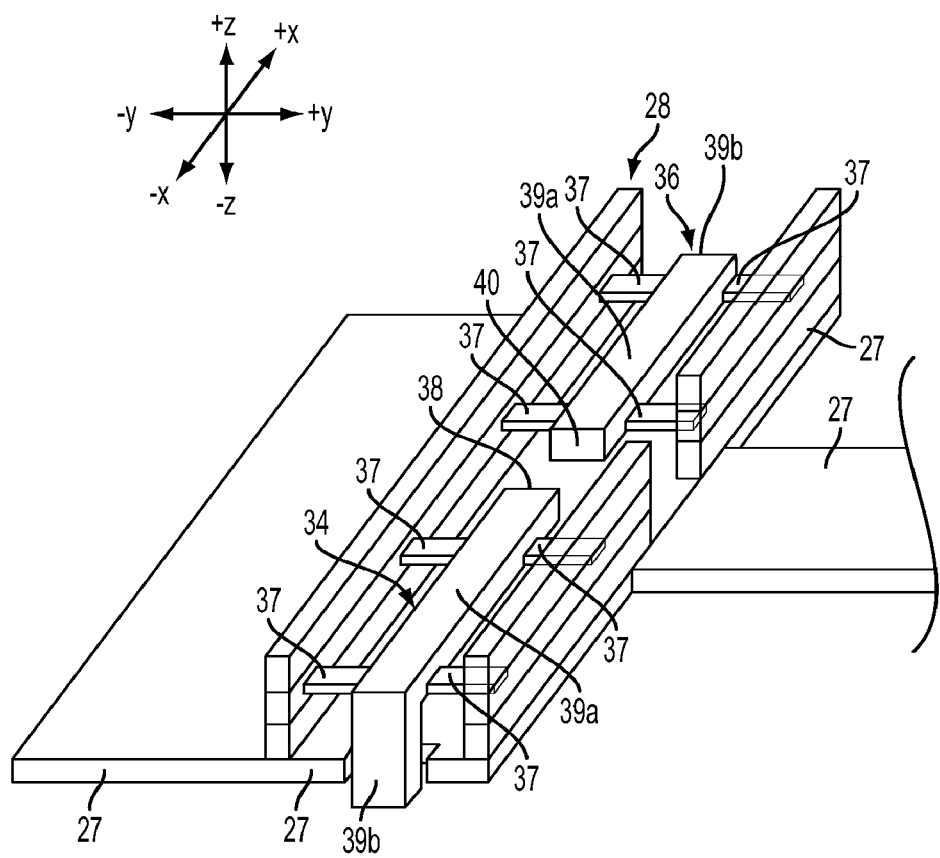
FIG. 2 is a top perspective view of a ground housing, and a portion of a ground plane of the switch shown in FIG. 1, with a top layer of the housing removed for clarity of illustration.

The contact portion 12 further includes an electrically-conductive first inner conductor 34 and an electrically-conductive second inner conductor 36 each having a substantially rectangular cross section, as shown in FIGS. 1-4, 6A, and 6B. The first and second inner conductors 34, 36 each have a first portion 39a, and an adjoining second portion 39b. The first and second portions 39a, 39b extend in substantially perpendicular directions, as can be seen in FIG. 2. The first and second portions 39a, 39b are formed as part of the third layer of the copper material. The first portions 39a are positioned within the channel 30, and extend substantially in "x" direction as shown in FIGS. 1-4, 6A, and 6B. The second portions 39b are positioned proximate respective ends of the channel 30, and extend downwardly, i.e., in the "−z" direction, into the substrate 26 as shown in FIG. 2. As can be seen in FIGS. 1 and 2, the major portion 29a of the ground plane 27 is configured so that the second portions 39b do not contact the ground plane 27 as the second portions 39b extend downwardly into the substrate 26.

Figure 12:
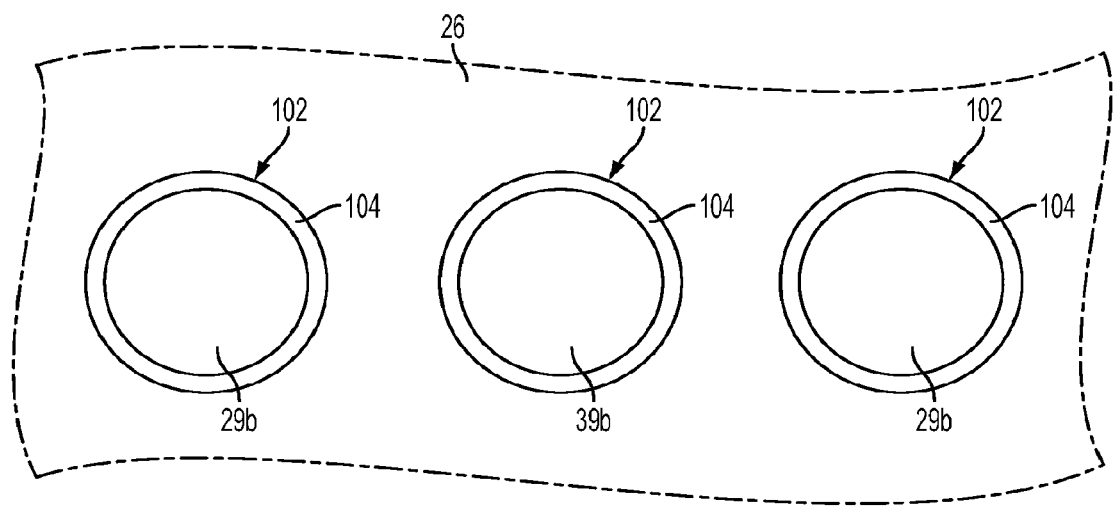
FIG. 12 is a magnified view of the area designated "J" in FIG. 10.

Two additional vias 102 are formed in the substrate 26 to accommodate the second portions 39b of the first and second inner conductors 34, 36. Each additional via 102 is formed between two of the vias 102 that accommodate the legs 29b of the ground plane 27, as illustrated in FIGS. 4, 10 and 12. One of the additional vias 102 is aligned with, and receives the second portion 39b of the first inner conductor 34, as shown in FIGS. 4, 10, 12, and 15C-29C. The other additional via 102 is aligned with, and receives the second portion 39b of the second inner conductor 36. As discussed below, the material from which the second portions 39b are formed is deposited in the associated vias 102 when the first layer of the switch 10 is formed.

The first and second inner conductors 34, 36 electrically contact the coating 104 of the vias 102 by way of the second portions 39b. The coating 104 associated with each of these vias 102 adjoins an associated electrically-conductive pad not shown) formed on the lower surface of the substrate 26. The pad associated with the second portion 39b of the first inner conductor 34 conveys signals between the first inner conductor 34 and the first electronic device. The pad associated with the second portion 39b of the second inner conductor 36 conveys signals between the second inner conductor 36 and the second electronic device. The first and second inner conductors 34, 36, therefore, are electrically connected to the respective first and second electronic devices by way of these pads and the coatings 104 of the associated vias 102. The first and second electronic devices can be integrated with the switch 10 by, for example, hybrid integration methods such as wire-bonding and flip-chip bonding.

Figure 3:
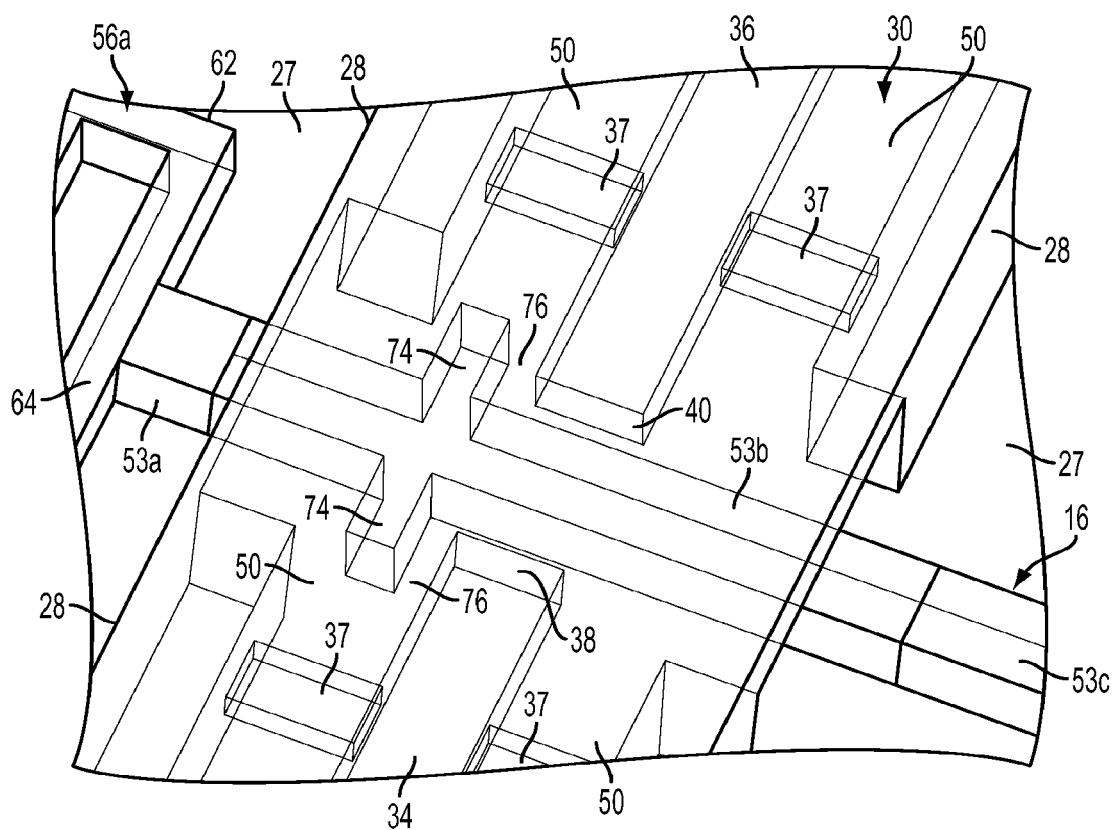
FIG. 3 is a magnified view of the area designated "C" in FIG. 1, depicting the housing and shuttle as transparent.

An end 38 of the first portion 39a of the first inner conductor 34 is positioned within the channel 30, as shown in FIGS. 2 and 3. An end 40 of the second portion 39a of the second inner conductor 36 likewise is positioned within the channel 30. The end 38 of the first inner conductor 34 is spaced apart from the end 40 of the second inner conductor 36 by an air gap 44, and as discussed below, by a portion of the shuttle 16 positioned within the air gap 44.

The first and second inner conductors 34, 36 are each suspended within the channel 30 on electrically-insulative tabs 37, as illustrated in FIGS. 2, 3, 6A and 6B. The tabs 37 are formed from a dielectric material. For example, the tabs 37 can be formed from polyethylene, polyester, polycarbonate, cellulose acetate, polypropylene, polyvinyl chloride, polyvinylidene chloride, polystyrene, polyamide, polyimide, benzocyclobutene, SU8, etc., provided the material will not be attacked by the solvent used to dissolve the sacrificial resist during fabrication of the switch 10 as discussed below. The tabs 37 can each have a thickness of, for example, approximately 15 µm. Each tab 37 spans the width, i.e., y-direction dimension, of the channel 30. The ends of each tab 37 are sandwiched between the portions of the second and third layers of electrically-conductive material that form the sides of the ground housing 28. The first portions 39a of the first and second inner conductors 34, 36 are surrounded by, and are spaced apart from the interior surfaces of the ground housing 28 by an air gap 50. The air gap 50 acts as a dielectric that electrically isolates the first and second inner conductors 34, 36 from the ground housing 28. The type of transmission-line configuration is commonly referred to as a "recta-coax" configuration, otherwise known as micro-coax.

The shuttle 16 has an elongated body 52 that extends substantially in the "y" direction, as shown in FIGS. 1-6B. The body 52 includes an electrically-insulative first portion 53a, and an adjoining, electrically-conductive second portion 53b. The body 52 also includes an electrically-insulative third portion 53c that adjoins the second portion 53b, and an electrically-conductive fourth portion 53d that adjoins the third portion 53c. The electrically-conductive second and fourth portions 53b, 53d of the body 52 are formed as part of the third layer of the electrically-conductive material. The electrically-insulative first and third portions 53a, 53c are formed from a dielectric material such as polyethylene, polyester, polycarbonate, cellulose acetate, polypropylene, polyvinyl chloride, polyvinylidene chloride, polystyrene, polyamide, polyimide, benzocyclobutene, SU8, etc., provided the material will not be attacked by the solvent used to dissolve the sacrificial resist during fabrication of the switch 10 as discussed below.

Figure 5A:
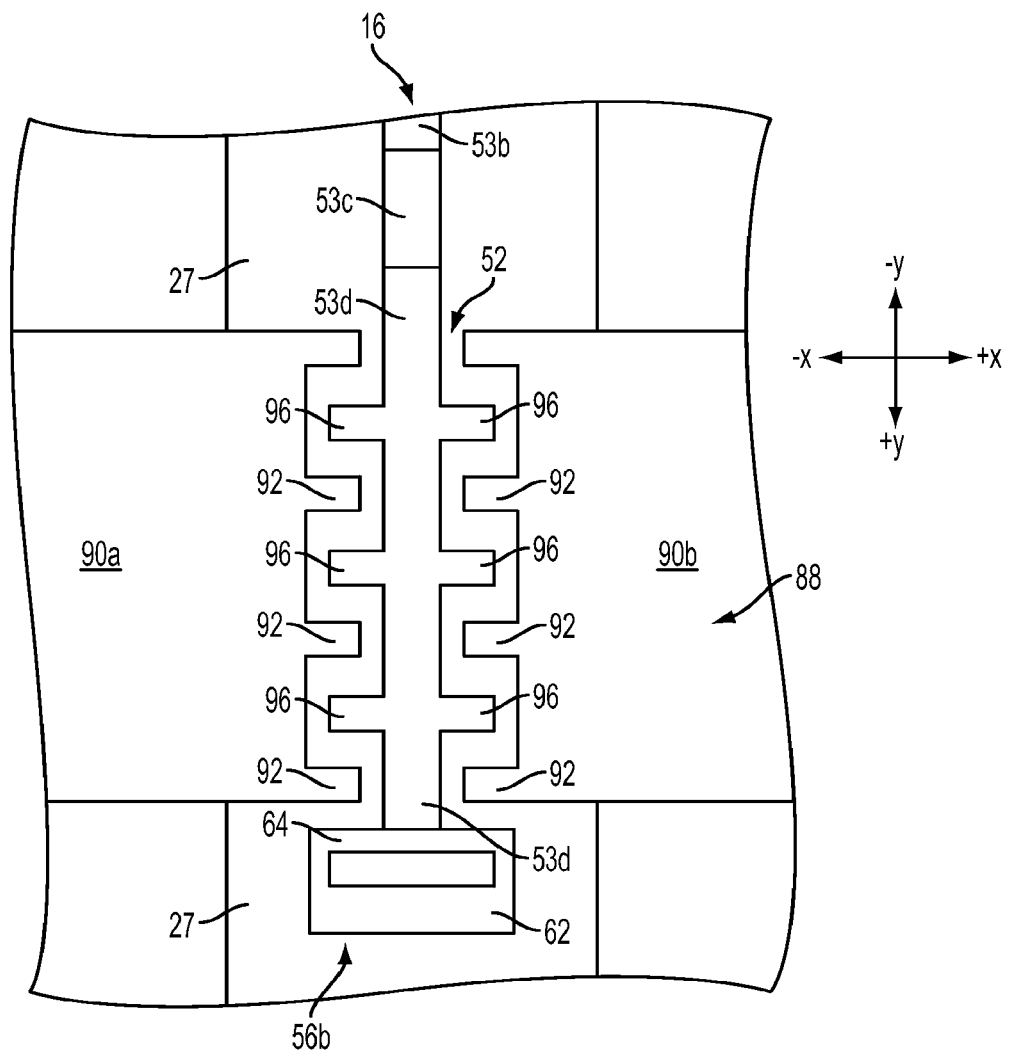
FIG. 5A is a top, magnified view of the area designated "A" in FIG. 1, depicting the shuttle in the open position.
Figure 5B:
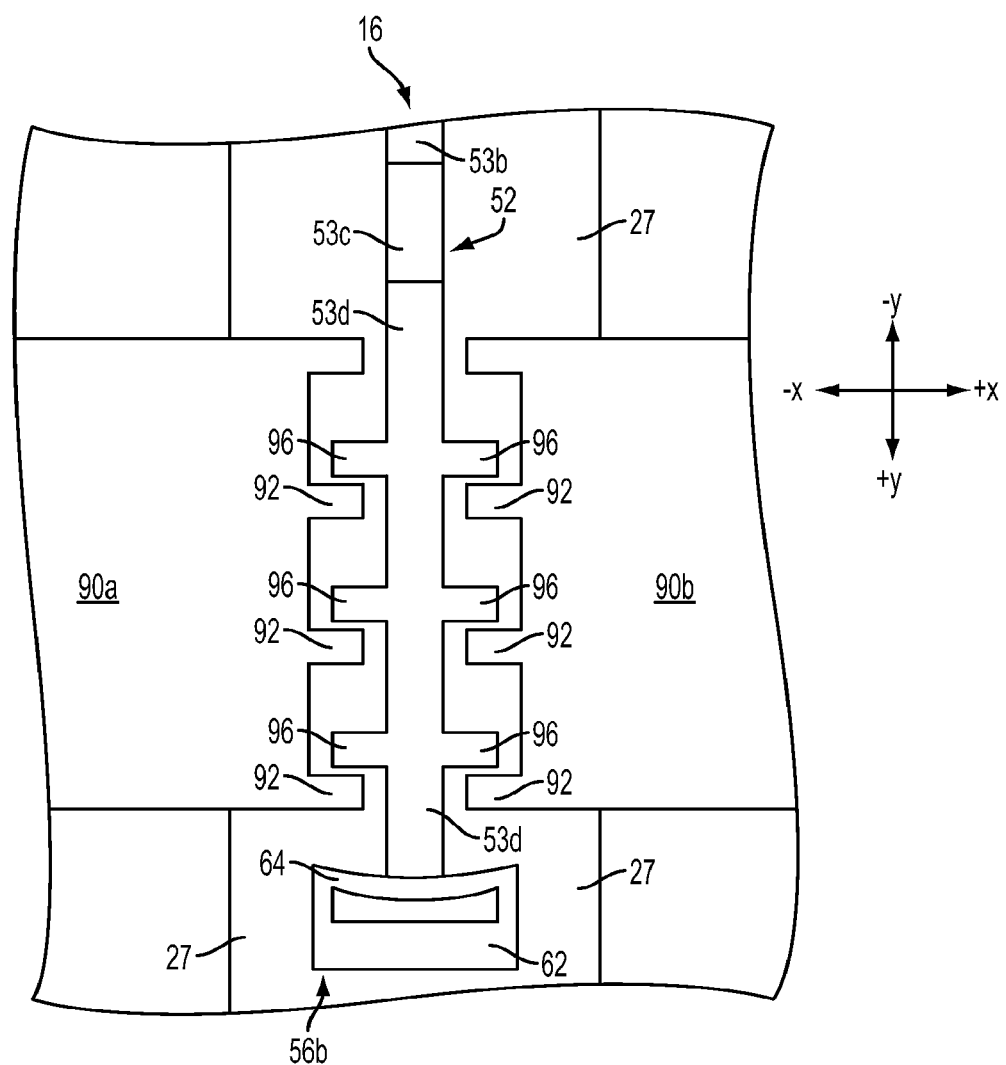
FIG. 5B is a top, magnified view of the area designated "A" in FIG. 1, depicting the shuttle in a closed position.
Figure 6A:
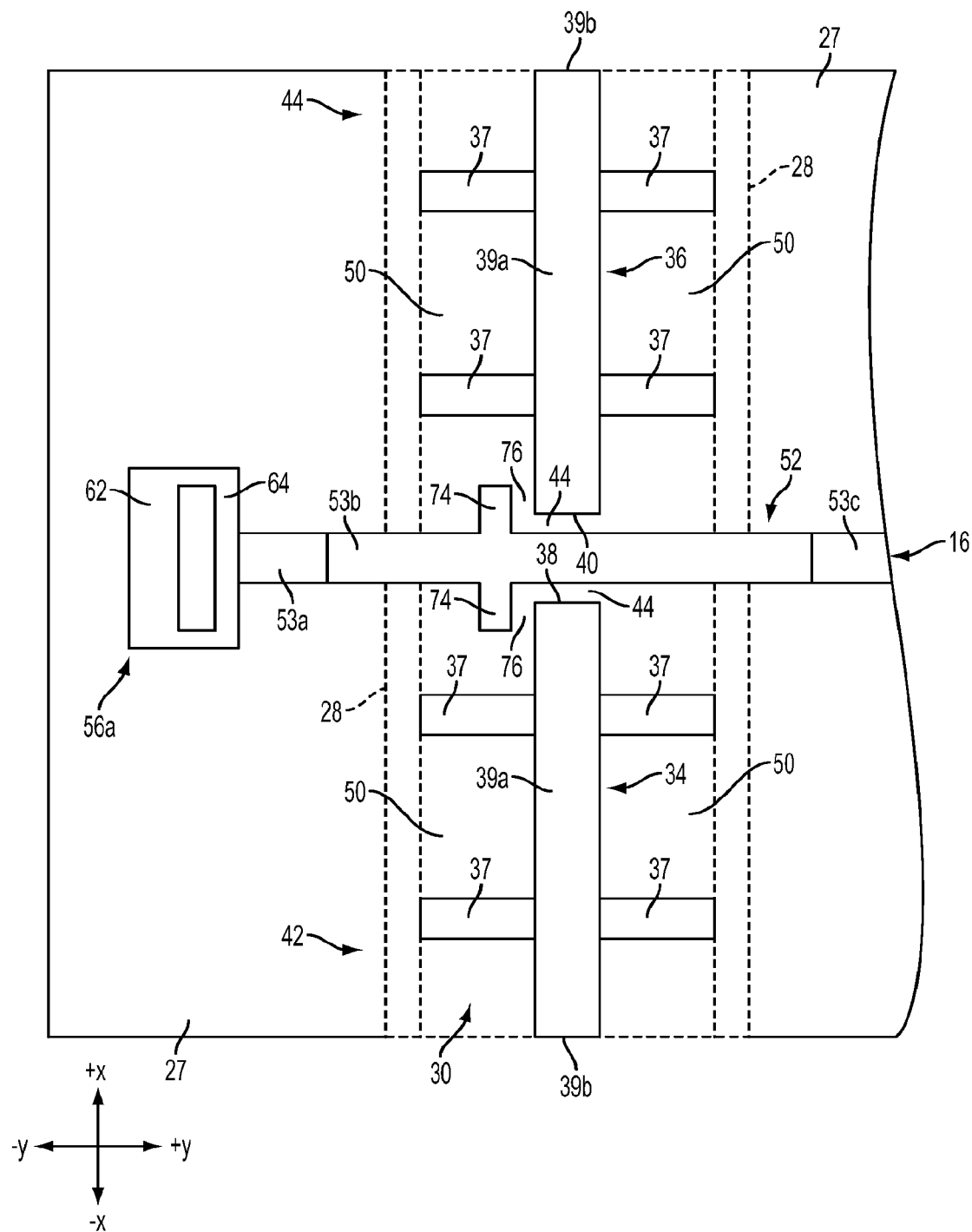
FIG. 6A is a top view of the area designated "B" in FIG. 1, depicting a ground housing of the switch in phantom, and depicting the shuttle in the open position.
Figure 6B:
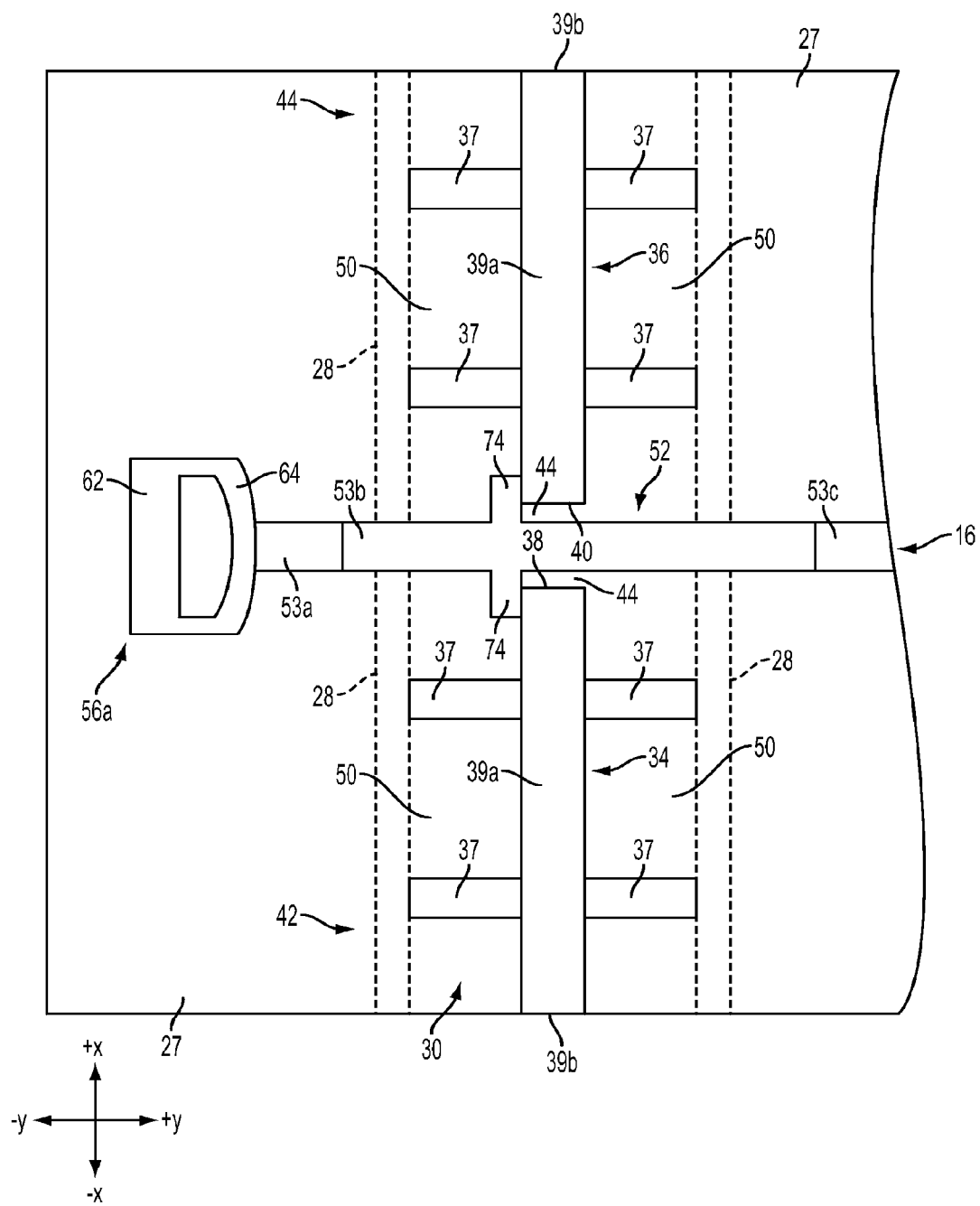
FIG. 6B is a top view of the area designated "B" in FIG. 1, depicting a ground housing of the switch in phantom, and depicting the shuttle in the closed position.

The switch 10 includes a first mount 56a and a substantially identical second mount 56b. The first mount 56a is disposed on the portion of the ground plane 27 associated with the contact portion 12 of the switch 10, as shown in FIGS. 1, 6A, and 6B. The second mount 56b is disposed on the portion of the ground plane 27 associated with the actuator portion 14 of the switch 10, as illustrated in FIGS. 1, 5A, and 5B.

The first and second mounts 56a, 56b each include a base 62 that adjoins the ground plane 27, and a beam portion 64 that adjoins the base 62. Each base 62 is formed as part of the second and third layers of the electrically-conductive material. The beam portions 64 are formed as part of the third layer of the electrically-conductive material. It should be noted that the configuration of the beam portions 64 is application-dependent, and can vary with factors such as the amount of space available to accommodate the beam portions 64, the required or desired spring constant of the beam portions 64, etc. Accordingly, the configuration of the beam portions 64 is not limited to that depicted in FIG. 1.

An end of the first portion 53a of the shuttle 16 adjoins the beam portion 64 of the first mount 56a, as depicted in FIGS. 1, 6A, and 6B. An end of the fourth portion 53d of the shuttle 16 adjoins the beam portion 64 of the second mount 56b, as illustrated in FIGS. 1, 5A, and 5B. The shuttle 16 is thus suspended from, and fully supported by the first and second mounts 56a, 56b by virtue of the mechanical connection between the first portion 53a of the shuttle 16 and the beam portion 64 of the first mount 56a; and the mechanical connection between the fourth portion 53d of the shuttle 16 and the beam portion 64 of the second mount 56b.

The beam portions 64 are configured to deflect so as to facilitate movement of the shuttle 16 in its lengthwise direction, i.e., in the "y" direction. In particular, the shuttle 16 is in its open position when the beam portions 64 are in their neutral, or un-deflected positions, as depicted in FIGS. 1, 3, 5A, and 6A. The beam portions 64 deflect when the shuttle 16 is urged in the "+y" direction, toward its closed position, by electrostatic forces developed in the actuator portion 14 as discussed below. The beam portions 64 are shown in their deflected state in FIGS. 5B and 6B.

The second portion 53b of the shuttle 16 includes two projections in the form of fingers 74, as shown in FIGS. 3, 6A and 6B. The fingers 74 are located on opposite sides of the second portion 53b, and extend substantially perpendicular to the lengthwise direction of the body 52, i.e., in the "+/−x" directions. The shuttle 16 is configured so that one of the fingers 74 faces, and is spaced apart from the first inner conductor 34 by an air gap 76 when the shuttle 16 is in its open position. The other finger 74 faces, and is spaced apart from the second inner conductor 36 by another air gap 76 when the shuttle 16 is in its open position. The air within the air gaps 76 acts as a dielectric insulator that electrically isolates the fingers 74 from the first and second inner conductors 34, 36 when the shuttle 16 is in its open position.

Movement of the shuttle 16 to its closed position causes each of the fingers 74 to traverse and close the associated air gap 76 as the finger 74 moves into contact with its associated first or second inner conductor 34, 36 as shown in FIG. 6B. The electrically-conductive fingers 74 and the adjoining second portion 53b of the body 52 thus bridge the air gaps 76 when the fingers 74 are in contact with the first and second inner conductors 34, 36, thereby establishing electrical contact between the first and second inner conductors 34, 36.

The air gaps 44, 76 act as a dielectric insulator that electrically isolates the first inner conductor 34 from the second inner conductor 36 when the shuttle 16 is in its open position. As shown in FIG. 6A, although the second portion 53b of the shuttle 16 extends though the air gap 44 between the ends 38, 40 of the first and second inner conductors 34, 36, the second portion 53b does not contact either of the ends 38, 40. Thus, current is not transmitted between the first and second inner conductors 34, 36 by way of the second portion 53b when the shuttle 16 is in its open position.

By bridging the air gaps 76 when the shuttle 16 is in the closed position, as shown in FIG. 6B, the shuttle 16 electrically connects the first and second inner conductors 34, 36, thereby closing the switch 10 so that electric current can flow through the switch 10 by way of a signal path formed by the first and second inner conductors 34, 36 and the second portion 53b of the shuttle 16.

The second portion 53b of the body 52 adjoins the electrically-insulative first and third portions 53a, 53c of the body 52, as depicted in FIGS. 1 and 3-6B. The first portion 53*a* electrically isolates the second portion 53*b* from the electrically-conductive first mount 56*a*. The third portion 53*c* electrically isolates the second portion 53*b* from the electrically-conductive fourth portion 53*d*. Thus, electrical isolation of the signal path through the switch 10 is achieved by way of the air gaps 50 between the first and second inner conductors 34, 36 and the adjacent internal surfaces of the ground housing 28; and by way of the first and third portions 53*a*, 53*c* of the shuttle 16.

The actuator portion 14 of the switch 10 includes a body 80, a first lead 82, and a second lead 83, as shown in FIGS. 1 and 4. The body 80 includes two legs 86, and an adjoining top portion 88. The legs 86 are formed as part of the first and second layers of the electrically-conductive material. The top portion 88 is formed as part of the third layer of the electrically-conductive material. The legs 86 are disposed on the substrate 26, on opposite sides of the ground plane 27 as shown in FIG. 1. The body 80 thus straddles the ground plane 27, and is not in mechanical or electrical contact with the ground plane 27.

The top portion 88 of the body 80 includes a first half 90*a* and a second half 90*b*, as depicted in FIGS. 1, 5A, and 5B. The first half 90*a* is associated with one of the legs 86, and the second half 90*b* is associated with the other leg 86 as shown in FIG. 1. The first and second halves 90*a*, 90*b* are positioned on opposite sides of the fourth portion 53*d* of the shuttle 16. The first and second halves 90*a*, 90*b* each include three projections in the form of fingers 92 that extend substantially in the "x" direction. The optimal number of fingers 92 is application-dependent, and can vary with factors such as the amount of force that is needed to move the shuttle 16 to its closed position.

The fourth portion 53*d* of the body 52 of the shuttle 16 includes six projections in the form of fingers 96 that extend substantially in the "x" direction as illustrated in FIGS. 1, 5A, and 5B. Three of the fingers 96 are disposed on a first side of the fourth portion 53*d*, and the other three fingers 96 are disposed on the other side of the fourth portion 53*d*. The fourth portion 53*d* and the first and second halves 90*a*, 90*b* of the body 80 are configured so that the fingers 92 and the fingers 96 are interleaved or interdigitated, i.e., the fingers 92, 96 are arranged in an alternating fashion along the "y" direction. Moreover, each of the fingers 96 is positioned proximate an associated one of the fingers 92 as depicted in FIG. 5A, and is separated from the associated finger 92 by a gap of, for example, approximately 50 μm when the shuttle 16 is in its open position.

The first and second leads 82, 83 of the actuating portion 14 each have a first portion 98*a*, and an adjoining second portion 98*b*. The first portions 98*a* are depicted in FIGS. 1 and 4; the second portions 98*b* are shown in FIGS. 4, 8, 9, and 11. The first and second portions 98*a*, 98*b* extend in substantially perpendicular directions. The first portions 98*a* are disposed on the substrate 26 as shown in FIG. 1, and are formed as part of the first layer of the electrically conductive material. The first portion 98*a* of the first lead 82 adjoins the leg 86 associated with the first half 90*a* of the top portion 88 of the body 80. The first portion 98*a* of the second lead 83 adjoins the leg 86 associated with the second half 90*b* of the top portion 88.

The second portion 98*b* of the first lead 82 aligns with, and is disposed in another metalized via 102 formed in the substrate 26, as depicted in FIGS. 4, 8, 9, and 11. The second portion 98*b* of the second lead 83 likewise aligns with, and is disposed in an additional metalized via 102 formed in the substrate 26. The material from which the second portions 98*b* are formed is deposited in the associated vias 102 when the first layer of the switch 10 is formed.

The first and second leads 82, 83 electrically contact the coating 104 of the vias 102 by way of the second portions 98*b*. The coating 104 associated with each of these vias 102 adjoins an associated electrically-conductive pads (not shown) formed on the lower surface of the substrate 26. The pads are electrically connected to a voltage source, such as a 120-volt direct current (DC) voltage source (not shown). Power can thus be conveyed to the second portions 98*b* of the first and second leads 82, 83 by way of these pads, and the coatings 104 of the associated vias 102.

Because the first and second halves 90*a*, 90*b* of the top portion 88 are in contact with their associated legs 86, energization of the first and second leads 82, 83 results in energization of the first and second halves 90*a*, 90*b*, including the fingers 92. Subjecting the first and second leads 82, 83 to a voltage causes the shuttle 16 to move from its open to its closed position, and to remain in the closed position, due to the resulting electrostatic attraction between the shuttle 16 and the actuator portion 14, as follows. As discussed above, the first portion 53*a* of the shuttle 16 adjoins the beam portion 64 of the first mount 56*a*, and the fourth portion 53*d* of the shuttle 16 adjoins the beam portion 64 of the second mount 56*b*, so that the shuttle 16 is suspended from the first and second mounts 56*a*, 56*b*. The beam portions 64 are in their neutral or un-deflected positions when the shuttle 16 is in its open position, as depicted in FIGS. 5A and 6A. Moreover, the fourth portion 53*d* of the shuttle 16 is electrically connected to the ground plane 27 by way of the second mount 56*b*, and is electrically isolated from the second portion 53*b* of the shuttle 16 by the third portion 53*c* of the shuttle 16. The fourth portion 53*d*, including the fingers 96 thereof, thus remains in a grounded, or zero-potential state at all times.

Subjecting the first and second leads 82, 83 of the actuator portion 14 to a voltage potential results in energization of the fingers 92, as discussed above. The energized fingers 92 act as electrodes, i.e., an electric field is formed around each finger 92 due the voltage potential to which the finger 92 is being subjected. Each of the energized fingers 92 is positioned sufficiently close to its associated finger 96 on the grounded shuttle 16 so as to subject the associated finger 96 to the electrostatic force resulting from the electric field around the finger 92. The electrostatic force attracts the finger 96 to its corresponding finger 92.

The net electrostatic force acting on the six fingers 96 urges the shuttle 16 in the "+y" direction. The beam portions 64 of the first and second mounts 56*a*, 56*b*, which were in their neutral or un-deflected state prior to energization of the fingers 92, are configured to deflect in response to this force as shown in FIGS. 5B and 6B, thereby permitting the suspended shuttle 16 to move in the "+y" direction to its closed position.

The enclosure 100 completely covers the other components of the switch 10, and together with the substrate 26, hermetically seals the internal components of the switch 10 from the surrounding environment. As discussed below, the enclosure 100 is sealed while being subjected to a vacuum, to minimize or eliminate the presence of moisture and other contaminants within the enclosure 100. The enclosure 100 thus protects the internal components of the switch 10 from environmental contaminants, and from mechanical damage potentially caused by the switch 10 being struck, jammed, or otherwise interfered with by other objects.

The shape of the enclosure 100 generally follows the outer contours of the rest of the switch 10, as shown in FIGS.

1 and 7-9. Moreover, as can be seen in FIGS. 8, 9, and 26A-26C, the enclosure 100 does not contact the internal components of the switch 10, and the adjacent surfaces of the enclosure 100 and the other components of the switch 10 are spaced apart by a distance approximately equal to the thickness of one layer of the copper material. Because the internal components of the switch 10 are made up of five layers of the copper material, the enclosure 100 is thus formed from seven layers of the copper material so that enclosure 100 covers the internal components at their highest point, while remaining spaced apart from the internal components by a distance approximately equal to the thickness of one layer. The contoured configuration of the enclosure 100, in combination with the minimal spacing between the enclosure 100 and the internal components of the switch 10, help to minimize the overall dimensional footprint of the enclosure 100.

Moreover, integrating the electrical interconnections for the switch 10 with the substrate 26 in the above-described manner obviates any need to equip the switch 10 with connectors or other stand-alone features for establishing the requisite electrical contact with other components. The interconnection method described herein can thereby help to minimize the dimensional footprint and complexity of the switch 10, and also helps to minimize the potential for the hermetic seal formed by the enclosure 100 and the substrate 26 to be compromised.

The switch 10 and alternative embodiments thereof can be manufactured using known processing techniques for creating three-dimensional microstructures, including coaxial transmission lines. For example, the processing methods described in U.S. Pat. Nos. 7,898,356 and 7,012,489, the disclosure of which is incorporated herein by reference, can be adapted and applied to the manufacture of the switch 10 and alternative embodiments thereof The enclosure 100 and the other components of the switch 10 can be formed simultaneously, in accordance with the following process which is depicted in FIGS. 14A-29C. The enclosure 100 and the internal components of the switch 10 are fabricated by depositing, on a sequential basis, the seven layers of copper material from which the switch 10 are formed.

Figure 7:
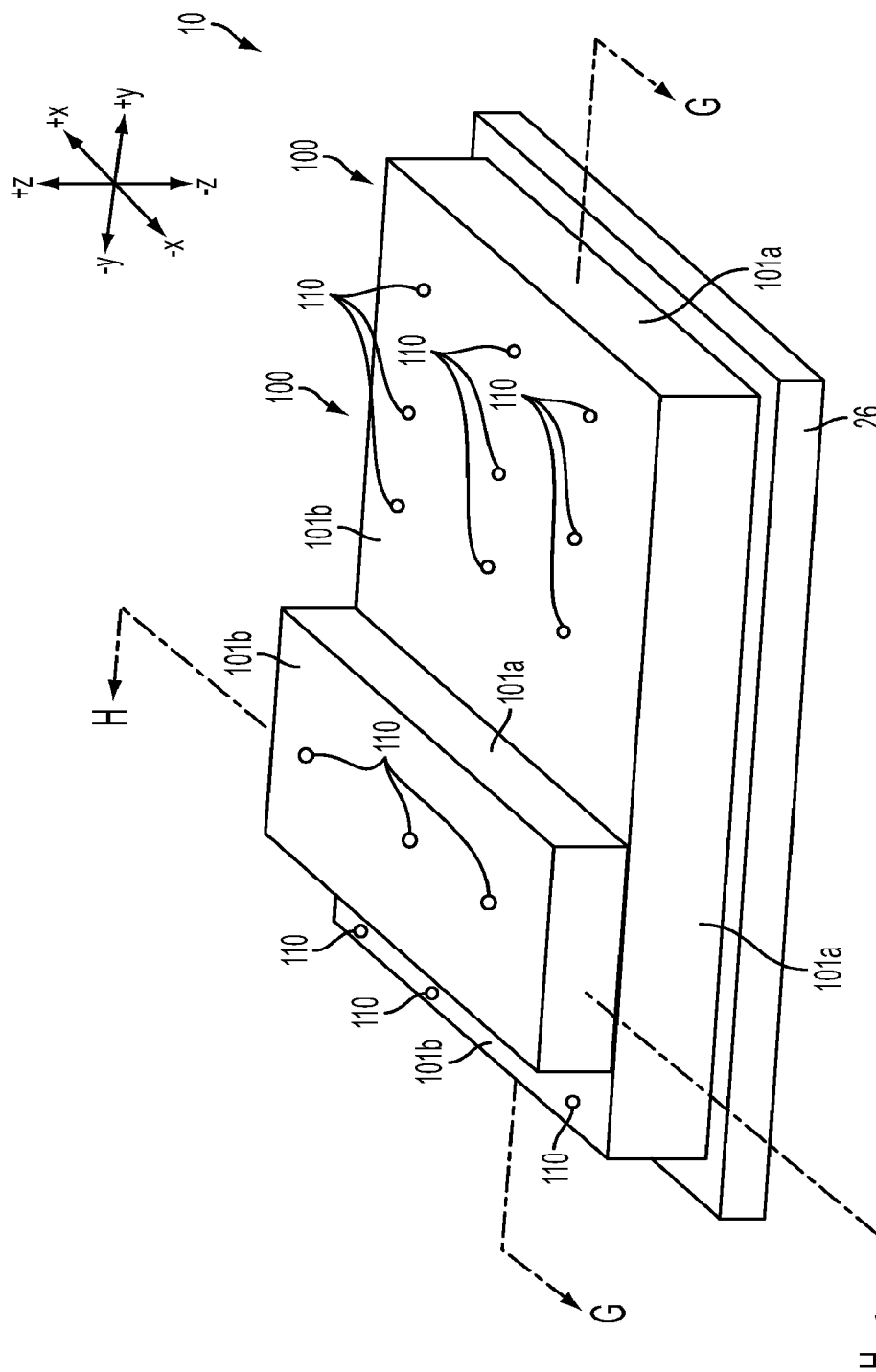
FIG. 7 is a perspective view of the encapsulating enclosure of the switch shown in FIGS. 1-6B.

The first, or lowermost layer of the copper material forms the major portion 29a of the ground plane 27; part of the second portions 39b of the first and second inner conductors 34; a portion of each leg 86 of the body 80 of the actuator portion 14; and part of the first portions 98a of the first and second leads 82, 83 of the actuator portion 14. The first layer of copper material also forms portions of the sides 101a of the enclosure 100, as shown in FIGS. 7, 8, and 9. The first layer is formed by selectively applying a first photoresist layer 200 to the upper surface of the substrate 26 utilizing a mask or other suitable means, so that the only exposed portions of the upper surface correspond to the positions at which the ground plane 27, the legs 86, the leads 82, 83, and the sides 101a of the enclosure 100 are to be located, as shown in FIGS. 14A-14C.

The copper material is subsequently deposited on the exposed portions of the substrate 26 to a predetermined thickness, to form the first layer of the copper material as shown in FIGS. 15A-15C. The deposition of the copper material is accomplished using a suitable technique such as chemical vapor deposition (CVD). Other suitable techniques, such as physical vapor deposition (PVD), sputtering, or electroplating, can be used in the alternative. The upper surfaces of the newly-formed first layer can be planarized using a suitable technique such as chemical-mechanical planarization (CMP).

The upper end of each via 102 is located within an exposed portion of the substrate 26, as can be seen in FIG. 14C. The vias 102, therefore, are exposed when the first layer of copper material is deposited on the substrate 26. The vias 102 are thus filled with the copper material as the first layer is deposited, thereby forming the legs 29b of the ground plane 27 and the second portions 98b of the first and second leads 82, 83, and partially forming the second portions 39b of the first and second inner conductors 34, 36, as illustrated in FIG. 15C.

The second layer of copper material forms portions of the sides of the ground housing 28; another part of the second portions 39b of the first and second inner conductors 34; another portion of each leg 86; another part of the first portions 98a of the first and second leads 82, 83; and the base 62 of each of the first and second mounts 56a, 56b. The second layer of copper material also forms additional portions of the sides 101a of the enclosure 100. A second photoresist layer 202 is formed by patterning additional photoresist material in the desired shape of the second photoresist layer 202 over the partially-constructed switch 10 and over the previously-applied first photoresist layer 200, using a mask or other suitable technique, so that the only exposed areas on the partially-constructed switch 10 correspond to the locations at which the above-noted portions of the switch 10 are to be located, as shown in FIGS. 16A-16C. The copper material is subsequently deposited on the exposed portions of the switch 10 to a predetermined thickness, to form the second layer of the copper material as shown in FIGS. 17A-17B. The upper surfaces of the newly-formed portions of the switch 10 are then planarized.

The dielectric material that forms the tabs 37 is then deposited and patterned on top of the previously-formed photoresist layer as shown in FIGS. 18B and 18C. The dielectric material that forms the first and third portions 53a, 53b of the body 52 of the shuttle 16 is deposited and patterned on top of the previously-formed photoresist layer as shown in FIG. 18A, before or after the tabs 37 are formed.

The third layer of the copper material forms additional portions of the sides of the ground housing 28; the first portions 39a of the first and second inner conductors 34; the second and fourth portions 53b, 53d of the body 52 of the shuttle 16; the beam portions 64 of the first and second mounts 56a, 56b; and the top portion 88 of the body 80 of the actuator portion 14. The third layer of copper also forms additional portions of the sides 101a of the enclosure 100. A third photoresist layer 204 is applied to the partially-constructed switch 10 by patterning additional photoresist material in the desired shape of the third photoresist layer 204 over the partially-constructed switch 10, and over the second photoresist layer 202 utilizing a mask or other suitable means, so that the only exposed areas on the partially-constructed switch 10 correspond to the locations at which the above-noted components are to be located, as shown in FIGS. 19A-19C. The copper material is subsequently deposited on the exposed portions of the switch 10 to a predetermined thickness, to form the third layer of copper material as shown in FIGS. 20A-20C. The upper surfaces of the newly-formed portions of the switch 10 can then be planarized.

The fourth layer of the copper material forms additional portions of the sides of the ground housing 28, and additional portions of the sides 101a of the enclosure 100. The fifth layer of the copper material forms the top of the ground housing 28, and portions of the top 101b of the enclosure 100. The fourth and fifth layers are formed in a manner similar to the first, second, and third layers. In particular, a fourth photoresist layer 206 is formed by applying additional photoresist material to the partially-constructed switch 10, and over the third photoresist layer 204 utilizing a mask or other suitable means, as shown in FIGS. 21A-21C. Additional copper material is then deposited on the exposed areas to form the fourth layer of the switch 10 as shown in FIGS. 22A-22C. A fifth photoresist layer 208 is subsequently formed by applying additional photoresist material to the partially-constructed switch 10, and over the fourth photoresist layer 206 utilizing a mask or other suitable means, as shown in FIGS. 23A-23C. Additional copper material is then deposited on the unmasked areas to form the fifth layer of the switch 10 as shown in FIGS. 24A-24C. The upper surfaces of the newly-formed portions of the switch 10 can be planarized after each of the fourth and fifth layers of copper material have been applied.

The fifth photoresist layer 208 is configured so that holes 110 are formed in the portion of the fifth layer corresponding to the top 101b of the enclosure 100. The holes 110, as discussed below, are filled in a subsequent step of the fabrication process for the switch 10. The holes 110 are depicted in FIGS. 7-9. The holes 110 can have a diameter of, for example, 10 μm. The overall number and locations of the holes 110 can vary from that disclosed herein.

The sixth layer of the copper material forms additional portions of the sides 101a of the enclosure 100. The seventh layer of the copper material forms additional portions of the top 101b of the enclosure 100. The six and seventh layers are formed in a manner similar to the first through fifth layers. In particular, a sixth photoresist layer 210 is formed by applying additional photoresist material to the partially-constructed switch 10, and over the fifth photoresist layer 208 utilizing a mask or other suitable means, as shown in FIGS. 25A-25C. Additional copper material is then deposited on the exposed areas to form the sixth layer of the enclosure 100 as shown in FIGS. 26A-26C. A seventh photoresist layer 212 is subsequently formed by applying additional photoresist material to the partially-constructed switch 10, and over the sixth photoresist layer 210 as shown in FIGS. 27A-27C. Additional copper material is then deposited on the exposed areas to form the seventh layer of the enclosure 100 as shown in FIGS. 28A-28C. The upper surfaces of the newly-formed portions of the enclosure 100 are planarized after the application of each of the sixth and seventh layers. The seventh photoresist layer 212 is configured so that additional holes 110 are formed in the portion of the top 101b of the enclosure 100 corresponding to the seventh layer, as shown in FIGS. 7-9.

The photoresist material remaining from each of the masking steps is released or otherwise removed after the seventh layer of copper material has been applied as depicted in FIGS. 29A-29C. Removal of the photoresist material is accomplished, for example, by exposing the photoresist material to an appropriate solvent that causes the photoresist material to dissolve. The solvent is introduced into the interior of the enclosure 100 by way of the holes 110 formed in the enclosure 100. The dissolved photoresist and solvent can be purged from the volume within the enclosure 100 via the holes 110.

Figure 13:
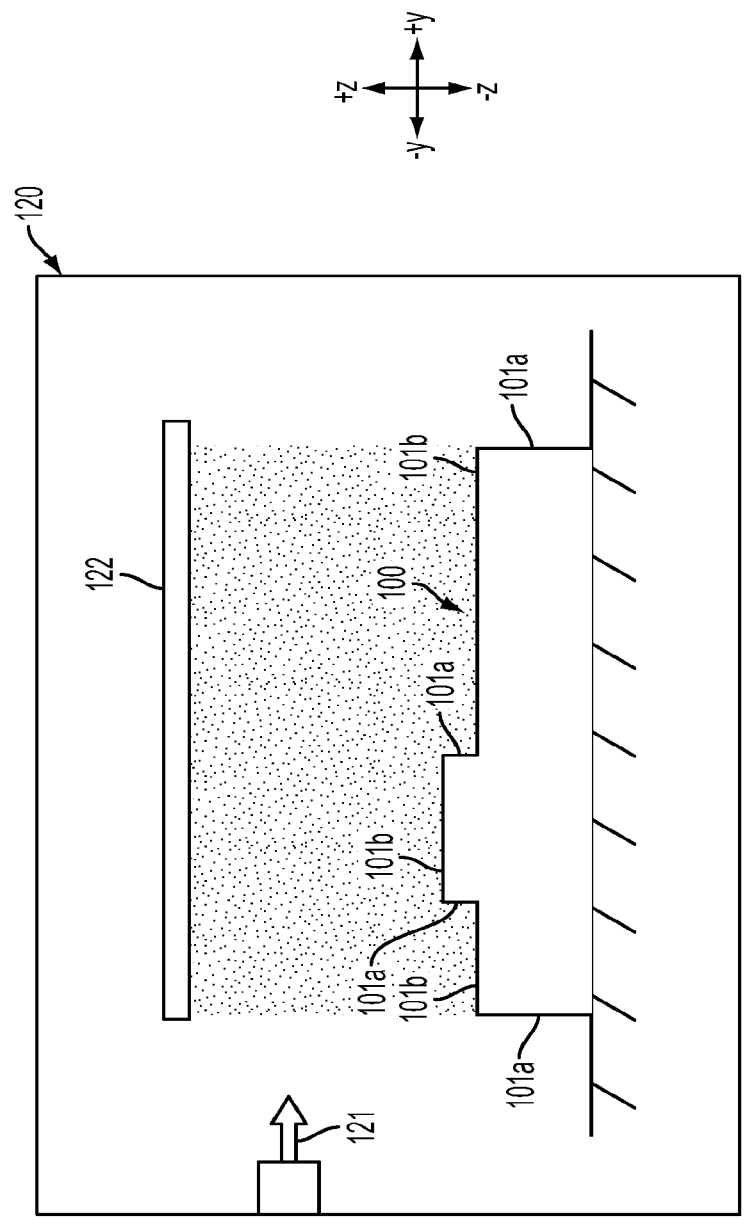
FIG. 13 is a side view of the switch shown in FIGS. 1-12 installed in a vacuum chamber and undergoing a sputter deposition process.

The holes 110 in the enclosure 100 are to be subsequently filled to isolate the internal components of the switch 10 from the surrounding environment. In particular, the switch 10 can be placed in a chamber 120 configured to apply a thin film of metal to the enclosure 100 under a partial vacuum, by a suitable technique such as sputter deposition. The chamber 120 is depicted in FIG. 13. A partial vacuum, e.g., 10-6 Torr, is drawn in the chamber 120 once the switch 10 has been placed therein the chamber 120 has been sealed. A sputtering gas 121 is introduced into the chamber to liberate metallic material, e.g., copper, from a sputtering target 122 within the chamber 120. The liberated copper material forms layers of thin film within the holes 110 (and over the exterior surfaces of the enclosure 100). The layers of thin film within the holes 110 eventually thicken so as to fill in the holes 110, thereby forming an airtight barrier between the interior of the enclosure 100 and the surrounding environment.

The use of a sputter deposition process to fill the holes 110 is disclosed for exemplary purposes only. Other suitable techniques, including other types of physical vapor deposition (PVD) and chemical vapor deposition (CVD) processes, can be used in the alternative.

What is claimed is:

1. A process for fabricating a miniaturized switch having an encapsulating enclosure, the process comprising:
    selectively applying an electrically-conductive material to a portion of a substrate to form a first layer of the switch, the first layer of the switch comprising: at least a portion of a ground plane;
    a portion of an actuator; and a portion of a side of the enclosure;
        selectively applying more of the electrically-conductive material to form a second layer of the switch, the second layer comprising: a second portion of the actuator; and a second portion of the side of the enclosure; and
        selectively applying more of the electrically-conductive material to form a third layer of the switch, the third layer comprising a contact element configured to be moved by the actuator into and out of contact with a first and a second electrical conductor of the switch.

2. The process of claim 1, wherein selectively applying more of the electrically-conductive material to form a third layer of the switch further comprises applying more of the electrically-conductive material to form a portion of an electrically-conductive housing having the first electrical conductor suspended therein on electrically-insulative supports.

3. The process of claim 2, wherein selectively applying more of the electrically-conductive material to form a third layer of the switch further comprises applying more of the electrically-conductive material to form at least a portion of the first electrical conductor and at least a portion of the second electrical conductor.

4. The process of claim 1, further comprising forming a leg of the ground plane and respective portions of the first and second electrical conductors by applying more of the electrically-conductive material in a plurality of metalized vias in the substrate.

5. The process of claim 3, further comprising applying more of the electrically-conductive material to form a fourth, a fifth, and a sixth layer of the switch, the fourth layer being disposed at least in part between the second and the third layers and comprising: another portion of the housing, and another portion of the side of the enclosure; the fifth layer being disposed at least in part between the third and the fourth layers and comprising a top of the housing and another portion of the side of the enclosure; and the sixth layer being disposed at least in part between the third and the fifth layers and comprising another portion of the side of the enclosure.

6. The process of claim 1, further comprising utilizing a first mask to the substrate to partially cover the substrate; wherein selectively applying an electrically-conductive material on a portion of a substrate to form a first layer of the switch comprises selectively applying the electrically-conductive material to an exposed portion of the substrate.

7. The process of claim 6, further comprising utilizing a second mask to partially cover the first layer; wherein selectively applying more of the electrically-conductive material to form a second layer of the switch comprises applying the electrically-conductive material to an exposed portion of the first layer.

8. The process of claim 7, further comprising exposing the first and second layers to a solvent that dissolves remaining photoresist material from which the first and second layers are formed.

9. The process of claim 8, further comprising removing material dissolved by the solvent by way of a through hole formed in the enclosure.

10. The process of claim 9, further comprising sealing the through hole after removing the dissolved material from the enclosure.

11. The process of claim 10, wherein sealing the through hole after removing the dissolved material from the enclosure comprises sealing the through hole while subjecting the enclosure to a vacuum.

12. The process of claim 10, wherein sealing the through hole after removing the dissolved material from the enclosure comprises filling the through hole using a sputter deposition process.

13. A process for fabricating a MEMS device having an encapsulating enclosure, the process comprising:
utilizing a first mask to form an exposed portion of a photoresist material on a portion of the substrate;
applying an electrically-conductive material to an exposed portion of the substrate to form a first layer of the device, the first layer of the device including at least a portion of a ground plane and a first portion of a side of the encapsulating enclosure;
utilizing a second mask to form an exposed portion of more of the photoresist material on a portion of the first layer;
subsequently applying more of the electrically-conductive material to form a second layer of the device, the second layer of the device comprising a first portion of a housing and a second portion of the side of the encapsulating enclosure, where the housing is a different structural element than the encapsulating enclosure;
utilizing a third mask to form an exposed portion of more of the photoresist material on a portion of the second layer; and
subsequently applying more of the electrically-conductive material to form a third layer of the device, the third layer of the device comprising: a second portion of the housing; at least a portion of an electrical conductor suspended within, electrically insulated from, and spaced apart from the housing; and a third portion of the side of the encapsulating enclosure.

14. The process of claim 13, further comprising:
utilizing a fourth mask to form an exposed portion of more of the photoresist material on a portion of the third layer and substrate;
subsequently applying more of the electrically-conductive material to form a fourth layer of the device, the fourth layer of the device comprising a third portion of the housing and a fourth portion of the side of the encapsulating enclosure;
utilizing a fifth mask to form an exposed portion of more of the photoresist material on a portion of the fourth layer and substrate;
subsequently applying more of the electrically-conductive material to form a fifth layer of the device, the fifth layer of the device comprising a top of the housing, and a fifth portion of the side of the encapsulating enclosure;
utilizing a sixth mask to form an exposed portion of more of the photoresist material on a portion of the fifth layer;
subsequently applying more of the electrically-conductive material to form a sixth layer of the device, the sixth layer of the device comprising a sixth portion of the side of the encapsulating enclo sure;
utilizing a seventh mask to form an exposed portion of more of the photoresist material on a portion of the sixth layer;
subsequently applying more of the electrically-conductive material to form a seventh layer of the device, the seventh layer of the device comprising a top portion of the encapsulating enclo sure.

15. The process of claim 13, further comprising exposing the first, second, and third layers to a solvent that dissolves remaining photoresist material from which the first, second, and third layers are formed..

16. The process of claim 15, further comprising removing material dissolved by the solvent from the enclosure by way of a through hole formed in the enclosure.

17. The process of claim 16, further comprising sealing the through hole after removing the dissolved material from the enclosure.

18. The process of claim 17, wherein sealing the through hole after removing the dissolved material from the enclosure comprises sealing the through hole while subjecting the enclosure to a vacuum.

19. The process of claim 13, further comprising forming a leg of the ground plane and a portion of the electrical conductor by applying more of the electrically-conductive material in a plurality of metalized vias formed in the substrate.

* * * * *